United States Patent
Nakamura et al.

(10) Patent No.: US 10,593,854 B1
(45) Date of Patent: *Mar. 17, 2020

(54) TRANSPARENT LIGHT EMITTING DEVICE WITH LIGHT EMITTING DIODES

(71) Applicant: The Regents of the University of California, Oakland, CA (US)

(72) Inventors: Shuji Nakamura, Santa Barbara, CA (US); Steven P. DenBaars, Goleta, CA (US); Hirokuni Asamizu, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/570,754

(22) Filed: Sep. 13, 2019

Related U.S. Application Data

(63) Continuation of application No. 16/569,120, filed on Sep. 12, 2019, which is a continuation of application (Continued)

(51) Int. Cl.
*H01L 33/62* (2010.01)
*H01L 33/54* (2010.01)
(Continued)

(52) U.S. Cl.
CPC .......... *H01L 33/62* (2013.01); *G02B 19/0028* (2013.01); *G02B 19/0061* (2013.01); *H01L 33/22* (2013.01); *H01L 33/54* (2013.01); *H01L 33/58* (2013.01); *H01L 33/387* (2013.01); *H01L 33/60* (2013.01); *H01L 2224/0554* (2013.01); *H01L 2224/05568* (2013.01);
(Continued)

(58) Field of Classification Search
None
See application file for complete search history.

(56) References Cited

U.S. PATENT DOCUMENTS

| | | | |
|---|---|---|---|
| 3,607,463 A | 9/1971 | Kinoshita et al. | |
| 3,938,177 A | 2/1976 | Hansen et al. | |

(Continued)

FOREIGN PATENT DOCUMENTS

| | | | |
|---|---|---|---|
| AU | 754353 B2 | 11/2002 | |
| AU | 756072 B2 | 1/2003 | |

(Continued)

OTHER PUBLICATIONS

PCT/US2007/025343 International Search Report and Written Opinion dated Mar. 10, 2008.

(Continued)

*Primary Examiner* — Michelle Mandala
(74) *Attorney, Agent, or Firm* — Gates & Cooper LLP

(57) ABSTRACT

A transparent light emitting diode (LED) includes a plurality of III-nitride layers, including an active region that emits light, wherein all of the layers except for the active region are transparent for an emission wavelength of the light, such that the light is extracted effectively through all of the layers and in multiple directions through the layers. Moreover, the surface of one or more of the III-nitride layers may be roughened, textured, patterned or shaped to enhance light extraction.

6 Claims, 14 Drawing Sheets

Related U.S. Application Data

No. 16/567,275, filed on Sep. 11, 2019, which is a continuation of application No. 16/422,323, filed on May 24, 2019, now Pat. No. 10,454,010, which is a continuation of application No. 16/238,736, filed on Jan. 3, 2019, which is a continuation of application No. 14/461,151, filed on Aug. 15, 2014, now Pat. No. 10,217,916, which is a continuation of application No. 13/622,884, filed on Sep. 19, 2012, now Pat. No. 8,835,959, which is a continuation of application No. 11/954,154, filed on Dec. 11, 2007, now Pat. No. 8,294,166.

(60) Provisional application No. 60/869,447, filed on Dec. 11, 2006.

(51) Int. Cl.
  *H01L 33/58* (2010.01)
  *G02B 19/00* (2006.01)
  *H01L 33/22* (2010.01)
  *H01L 33/60* (2010.01)
  *H01L 33/38* (2010.01)

(52) U.S. Cl.
  CPC ............... *H01L 2224/05573* (2013.01); *H01L 2224/16245* (2013.01); *H01L 2224/48247* (2013.01); *H01L 2224/48257* (2013.01); *H01L 2224/49107* (2013.01); *H01L 2224/73265* (2013.01); *H01L 2924/00014* (2013.01); *H01L 2924/1815* (2013.01); *H01L 2933/0091* (2013.01)

(56) References Cited

U.S. PATENT DOCUMENTS

| | | |
|---|---|---|
| 3,999,280 A | 12/1976 | Hansen et al. |
| 4,026,692 A | 5/1977 | Bartholomew |
| 4,346,275 A | 8/1982 | Iwakiri et al. |
| 4,497,974 A | 2/1985 | Deckman et al. |
| 5,087,949 A | 2/1992 | Haltz |
| 5,376,580 A | 12/1994 | Kish et al. |
| 5,416,870 A | 5/1995 | Chun et al. |
| 5,696,389 A | 12/1997 | Ishikawa et al. |
| 5,705,834 A | 1/1998 | Egalon et al. |
| 5,708,280 A | 1/1998 | Lebby et al. |
| 5,775,792 A | 7/1998 | Wiese |
| 5,779,924 A | 7/1998 | Krames et al. |
| 5,780,867 A | 7/1998 | Fritz et al. |
| 5,905,275 A | 5/1999 | Nunoue et al. |
| 5,932,048 A | 8/1999 | Furukawa et al. |
| 5,952,681 A | 9/1999 | Chen |
| 6,015,719 A | 1/2000 | Kish, Jr. et al. |
| 6,022,760 A | 2/2000 | Lebby et al. |
| 6,133,589 A | 10/2000 | Krames |
| 6,155,699 A | 12/2000 | Miller et al. |
| 6,229,160 B1 | 5/2001 | Krames et al. |
| 6,294,800 B1 | 9/2001 | Duggal et al. |
| 6,310,364 B1 | 10/2001 | Uemura |
| 6,331,063 B1 | 12/2001 | Kamada et al. |
| 6,331,356 B1 | 12/2001 | Angelopoulos et al. |
| 6,335,548 B1 | 1/2002 | Roberts et al. |
| 6,357,889 B1 | 3/2002 | Duggal et al. |
| 6,373,188 B1 | 4/2002 | Johnson et al. |
| 6,376,851 B1 | 4/2002 | Worley |
| 6,396,082 B1 | 5/2002 | Fukasawa et al. |
| 6,417,019 B1 | 7/2002 | Mueller et al. |
| 6,429,462 B1 | 8/2002 | Shveykin |
| 6,452,217 B1 | 9/2002 | Wojnarkowski et al. |
| 6,482,664 B1 | 11/2002 | Lee et al. |
| 6,483,196 B1 | 11/2002 | Wojnarowski et al. |
| 6,486,499 B1 | 11/2002 | Krames et al. |
| 6,509,584 B2 | 1/2003 | Suzuki |
| 6,514,782 B1 | 2/2003 | Wierer et al. |
| 6,515,308 B1 | 2/2003 | Kneissl et al. |
| 6,525,335 B1 | 2/2003 | Krames |
| 6,525,464 B1 | 2/2003 | Chin |
| 6,547,423 B2 | 4/2003 | Marshall et al. |
| 6,548,956 B2 | 4/2003 | Forrest et al. |
| 6,550,953 B1 | 4/2003 | Ichikawa et al. |
| 6,569,544 B1 | 5/2003 | Alain et al. |
| 6,573,530 B1 | 6/2003 | Sargent et al. |
| 6,573,537 B1 | 6/2003 | Steigerwald et al. |
| 6,576,488 B2 | 6/2003 | Collins, III et al. |
| 6,586,882 B1 | 7/2003 | Harbers |
| 6,607,286 B2 | 8/2003 | West et al. |
| 6,607,931 B2 | 8/2003 | Streubel |
| 6,608,333 B1 | 8/2003 | Lee et al. |
| 6,608,439 B1 | 8/2003 | Sokolik et al. |
| 6,614,058 B2 | 9/2003 | Lin et al. |
| 6,635,902 B1 | 10/2003 | Lin |
| 6,649,939 B1 | 11/2003 | Wirth |
| 6,657,767 B2 | 12/2003 | Bonardi et al. |
| 6,674,096 B2 | 1/2004 | Sommers |
| 6,677,610 B2 | 1/2004 | Choi et al. |
| 6,682,950 B2 | 1/2004 | Yang et al. |
| 6,686,218 B2 | 2/2004 | Lin et al. |
| 6,686,676 B2 | 2/2004 | McNulty et al. |
| 6,700,137 B2 | 3/2004 | Horiuchi et al. |
| 6,717,362 B1 | 4/2004 | Lee et al. |
| 6,719,936 B2 | 4/2004 | Carlton et al. |
| 6,729,746 B2 | 5/2004 | Suehiro et al. |
| 6,730,939 B2 | 5/2004 | Eisert et al. |
| 6,737,532 B2 | 5/2004 | Chen et al. |
| 6,746,295 B2 | 6/2004 | Sorg |
| 6,759,804 B2 | 7/2004 | Ellens et al. |
| 6,765,236 B2 | 7/2004 | Sakurai |
| 6,774,401 B2 | 8/2004 | Nakada et al. |
| 6,777,871 B2 | 8/2004 | Duggal et al. |
| 6,784,460 B2 | 8/2004 | Ng et al. |
| 6,791,116 B2 | 9/2004 | Takahashi et al. |
| 6,791,119 B2 | 9/2004 | Slater et al. |
| 6,794,685 B2 | 9/2004 | Hata et al. |
| 6,798,136 B2 | 9/2004 | Sommers |
| 6,803,607 B1 | 10/2004 | Chan et al. |
| 6,809,345 B2 | 10/2004 | Watanabe |
| 6,841,934 B2 | 1/2005 | Wang et al. |
| 6,844,572 B2 | 1/2005 | Sawaki et al. |
| 6,870,311 B2 | 3/2005 | Mueller et al. |
| 6,874,910 B2 | 4/2005 | Sugimoto et al. |
| 6,876,149 B2 | 4/2005 | Miyashita |
| 6,893,890 B2 | 5/2005 | Takekuma et al. |
| 6,903,376 B2 | 6/2005 | Shen et al. |
| 6,903,381 B2 | 6/2005 | Lin et al. |
| 6,909,108 B2 | 6/2005 | Tang et al. |
| 6,914,267 B2 | 7/2005 | Fukasawa et al. |
| 6,914,268 B2 | 7/2005 | Shei et al. |
| 6,917,057 B2 | 7/2005 | Stokes et al. |
| 6,921,927 B2 | 7/2005 | Ng et al. |
| 6,922,424 B2 | 7/2005 | Weigert et al. |
| 6,936,761 B2 | 8/2005 | Pichler |
| 6,936,859 B1 | 8/2005 | Uemura et al. |
| 6,936,864 B2 | 8/2005 | Kondo |
| 6,940,704 B2 | 9/2005 | Stalions |
| 6,955,985 B2 | 10/2005 | Narayan |
| 6,961,190 B1 | 11/2005 | Tamaoki et al. |
| 6,964,877 B2 | 11/2005 | Chen et al. |
| 6,969,874 B1 | 11/2005 | Gee et al. |
| 6,969,946 B2 | 11/2005 | Steranka et al. |
| 6,972,208 B2 | 12/2005 | Hsieh et al. |
| 6,972,212 B2 | 12/2005 | Eisert et al. |
| 6,980,710 B2 | 12/2005 | Farahi et al. |
| 6,982,522 B2 | 1/2006 | Omoto |
| 6,987,613 B2 | 1/2006 | Pocius et al. |
| 6,989,555 B2 | 1/2006 | Goetz et al. |
| 6,997,580 B2 | 2/2006 | Wong |
| 6,998,281 B2 | 2/2006 | Taskar et al. |
| 7,008,858 B2 | 3/2006 | Liu et al. |
| 7,009,213 B2 | 3/2006 | Camras et al. |
| 7,009,217 B2 | 3/2006 | Liu et al. |
| 7,009,220 B2 | 3/2006 | Oohata |
| 7,015,514 B2 | 3/2006 | Baur et al. |

(56) References Cited

U.S. PATENT DOCUMENTS

| | | | |
|---|---|---|---|
| 7,018,859 | B2 | 3/2006 | Liao et al. |
| 7,019,456 | B2 | 3/2006 | Yasukawa et al. |
| 7,026,261 | B2 | 4/2006 | Hirose et al. |
| 7,026,657 | B2 | 4/2006 | Bogner et al. |
| 7,048,412 | B2 | 5/2006 | Martin et al. |
| 7,053,419 | B1 | 5/2006 | Camras et al. |
| 7,064,355 | B2 | 6/2006 | Camras et al. |
| 7,067,849 | B2 | 6/2006 | Yoo |
| 7,070,304 | B2 | 7/2006 | Imai |
| 7,070,312 | B2 | 7/2006 | Tatsukawa |
| 7,071,034 | B2 | 7/2006 | Ueda et al. |
| 7,072,096 | B2 | 7/2006 | Holman et al. |
| 7,084,435 | B2 | 8/2006 | Sugimoto et al. |
| 7,091,653 | B2 | 8/2006 | Ouderkirk et al. |
| 7,091,661 | B2 | 8/2006 | Ouderkirk et al. |
| 7,098,589 | B2 | 8/2006 | Erchak et al. |
| 7,105,860 | B2 | 9/2006 | Shei et al. |
| 7,112,916 | B2 | 9/2006 | Goh et al. |
| 7,119,271 | B2 | 10/2006 | King et al. |
| 7,126,159 | B2 | 10/2006 | Itai et al. |
| 7,129,635 | B2 | 10/2006 | Tsujimura |
| 7,135,709 | B1 | 11/2006 | Wirth et al. |
| 7,148,514 | B2 | 12/2006 | Seo et al. |
| 7,157,745 | B2 | 1/2007 | Blonder et al. |
| 7,161,189 | B2 | 1/2007 | Wu |
| 7,169,632 | B2 | 1/2007 | Baur et al. |
| 7,170,100 | B2 * | 1/2007 | Erchak ............... H01L 25/0753 257/88 |
| 7,188,981 | B2 | 3/2007 | Barros et al. |
| 7,195,991 | B2 | 3/2007 | Kamutsch et al. |
| 7,199,520 | B2 | 4/2007 | Fujii et al. |
| 7,210,806 | B2 | 5/2007 | Holman et al. |
| 7,217,004 | B2 | 5/2007 | Park et al. |
| 7,223,620 | B2 | 5/2007 | Jäger et al. |
| 7,223,998 | B2 | 5/2007 | Schwach et al. |
| 7,227,304 | B2 | 6/2007 | Tsujimura et al. |
| 7,235,817 | B2 | 6/2007 | Yano et al. |
| 7,250,728 | B2 | 7/2007 | Chen et al. |
| 7,253,447 | B2 | 8/2007 | Oishi et al. |
| 7,253,448 | B2 | 8/2007 | Roberts et al. |
| 7,262,440 | B2 | 8/2007 | Choi et al. |
| 7,264,378 | B2 | 9/2007 | Loh |
| 7,268,371 | B2 | 9/2007 | Krames et al. |
| 7,273,291 | B2 | 9/2007 | Kim et al. |
| 7,281,818 | B2 | 10/2007 | You et al. |
| 7,282,853 | B2 | 10/2007 | Yano et al. |
| 7,286,296 | B2 | 10/2007 | Chaves et al. |
| 7,291,864 | B2 | 11/2007 | Weisbuch et al. |
| 7,306,351 | B2 | 12/2007 | Chao et al. |
| 7,309,882 | B2 | 12/2007 | Chen |
| 7,312,573 | B2 | 12/2007 | Chang et al. |
| 7,314,291 | B2 | 1/2008 | Tain et al. |
| 7,317,210 | B2 | 1/2008 | Brabec et al. |
| 7,319,246 | B2 | 1/2008 | Soules et al. |
| 7,323,704 | B2 | 1/2008 | Itai |
| 7,329,982 | B2 | 2/2008 | Conner et al. |
| 7,332,747 | B2 | 2/2008 | Uemura et al. |
| 7,344,902 | B2 | 3/2008 | Basin et al. |
| 7,344,958 | B2 | 3/2008 | Murai et al. |
| 7,345,298 | B2 | 3/2008 | Weisbuch et al. |
| 7,352,006 | B2 | 4/2008 | Beeson et al. |
| 7,358,537 | B2 | 4/2008 | Yeh et al. |
| 7,358,539 | B2 | 4/2008 | Venugopalan et al. |
| 7,374,958 | B2 | 5/2008 | Pan et al. |
| 7,380,962 | B2 | 6/2008 | Chaves et al. |
| 7,390,117 | B2 | 6/2008 | Leatherdale et al. |
| 7,391,153 | B2 | 6/2008 | Suehiro et al. |
| 7,397,177 | B2 | 7/2008 | Takahashi et al. |
| 7,400,439 | B2 | 7/2008 | Holman |
| 7,408,204 | B2 | 8/2008 | Tung |
| 7,414,270 | B2 | 8/2008 | Kim et al. |
| 7,423,297 | B2 | 9/2008 | Leatherdale et al. |
| 7,427,145 | B2 | 9/2008 | Jang et al. |
| 7,431,477 | B2 | 10/2008 | Chou et al. |
| 7,439,551 | B2 | 10/2008 | Hata |
| 7,449,789 | B2 | 11/2008 | Chen |
| 7,463,419 | B2 | 12/2008 | Weber |
| 7,465,962 | B2 | 12/2008 | Kametani et al. |
| 7,479,662 | B2 | 1/2009 | Soules et al. |
| 7,479,664 | B2 | 1/2009 | Williams |
| 7,489,075 | B2 | 2/2009 | Lee |
| 7,498,734 | B2 | 3/2009 | Suehiro et al. |
| 7,504,671 | B2 | 3/2009 | Ishidu et al. |
| 7,509,012 | B2 | 3/2009 | Zoorob et al. |
| 7,510,289 | B2 | 3/2009 | Takekuma |
| 7,518,149 | B2 | 4/2009 | Maaskant et al. |
| 7,521,782 | B2 | 4/2009 | Ishii |
| 7,525,126 | B2 | 4/2009 | Leatherdale et al. |
| 7,531,835 | B2 | 5/2009 | Heeger et al. |
| 7,534,634 | B2 | 5/2009 | Jäger et al. |
| 7,541,610 | B2 | 6/2009 | Haase |
| 7,545,042 | B2 | 6/2009 | Yang |
| 7,579,629 | B2 | 8/2009 | Inoguchi |
| 7,582,910 | B2 | 9/2009 | David et al. |
| 7,585,083 | B2 | 9/2009 | Kim et al. |
| 7,586,127 | B2 | 9/2009 | Nomura et al. |
| 7,602,118 | B2 | 10/2009 | Cok et al. |
| 7,633,092 | B2 | 12/2009 | Ng et al. |
| 7,646,146 | B2 | 1/2010 | Cok |
| 7,670,872 | B2 | 3/2010 | Yan |
| 7,679,283 | B2 | 3/2010 | Nimura |
| 7,687,813 | B2 | 3/2010 | Nakamura et al. |
| 7,687,815 | B2 | 3/2010 | Kim |
| 7,692,205 | B2 | 4/2010 | Wang et al. |
| 7,693,360 | B2 | 4/2010 | Shimizu et al. |
| 7,704,763 | B2 | 4/2010 | Fujii et al. |
| 7,717,589 | B2 | 5/2010 | Nishioka et al. |
| 7,719,020 | B2 | 5/2010 | Murai et al. |
| 7,719,182 | B2 | 5/2010 | Cok et al. |
| 7,733,011 | B2 | 6/2010 | Cina et al. |
| 7,742,677 | B2 | 6/2010 | Eberhard et al. |
| 7,745,986 | B2 | 6/2010 | Ito et al. |
| 7,748,879 | B2 | 7/2010 | Koike et al. |
| 7,755,096 | B2 | 7/2010 | Weisbuch et al. |
| 7,766,508 | B2 | 8/2010 | Villard et al. |
| 7,772,597 | B2 | 8/2010 | Inoue |
| 7,781,787 | B2 | 8/2010 | Suehiro et al. |
| 7,781,789 | B2 | 8/2010 | Denbaars et al. |
| 7,847,302 | B2 | 12/2010 | Basin et al. |
| 7,851,815 | B2 | 12/2010 | Diamantidis |
| 7,860,356 | B2 | 12/2010 | Montfort et al. |
| 7,868,341 | B2 | 1/2011 | Diana et al. |
| 7,872,275 | B2 | 1/2011 | Diamantidis |
| 7,932,111 | B2 | 4/2011 | Edmond |
| 7,950,831 | B2 | 5/2011 | Moon |
| 7,956,371 | B2 | 6/2011 | Denbaars et al. |
| RE42,636 | E | 8/2011 | Chen et al. |
| 7,994,527 | B2 | 8/2011 | Denbaars et al. |
| 8,022,423 | B2 | 9/2011 | Nakamura et al. |
| 8,035,117 | B2 | 10/2011 | DenBaars et al. |
| 8,071,997 | B2 | 12/2011 | Scotch et al. |
| 8,109,635 | B2 | 2/2012 | Allon et al. |
| 8,124,991 | B2 | 2/2012 | Iso et al. |
| 8,158,987 | B2 | 4/2012 | Nabekura et al. |
| 8,162,493 | B2 | 4/2012 | Skiver et al. |
| 8,212,262 | B2 | 7/2012 | Emerson et al. |
| 8,258,519 | B2 | 9/2012 | Hsu |
| 8,294,166 | B2 | 10/2012 | Nakamura et al. |
| 8,334,151 | B2 | 12/2012 | Murai et al. |
| 8,368,109 | B2 | 2/2013 | Iso et al. |
| 8,378,368 | B2 | 2/2013 | Hsu et al. |
| 8,395,167 | B2 | 3/2013 | Kang et al. |
| 8,405,307 | B2 | 3/2013 | Yano et al. |
| 8,455,909 | B2 | 6/2013 | Negley |
| 8,541,788 | B2 | 9/2013 | DenBaars et al. |
| 8,558,446 | B2 | 10/2013 | Miki et al. |
| 8,637,892 | B2 | 1/2014 | Egoshi et al. |
| 8,710,535 | B2 | 4/2014 | Jo et al. |
| 8,835,959 | B2 | 9/2014 | Nakamura et al. |
| 8,860,051 | B2 | 10/2014 | Fellows et al. |
| 8,882,290 | B2 | 11/2014 | Hsieh et al. |
| 8,889,440 | B2 | 11/2014 | Chen et al. |
| 9,240,529 | B2 | 1/2016 | Fellows Demille et al. |
| 9,276,156 | B2 | 3/2016 | King et al. |

(56) References Cited

U.S. PATENT DOCUMENTS

| | | |
|---|---|---|
| 9,705,059 B2 | 7/2017 | Park |
| 9,859,464 B2 | 1/2018 | Fellows Demille et al. |
| 10,103,306 B2 | 10/2018 | Kim |
| 10,217,916 B2 | 2/2019 | Nakamura et al. |
| 10,312,422 B2 | 6/2019 | Camras et al. |
| 10,374,003 B2 | 8/2019 | Choi et al. |
| 10,454,010 B1 * | 10/2019 | Nakamura ......... G02B 19/0028 |
| 2001/0002049 A1 | 5/2001 | Reeh et al. |
| 2001/0033135 A1 | 10/2001 | Duggal et al. |
| 2002/0006040 A1 | 1/2002 | Kamada et al. |
| 2002/0085601 A1 | 7/2002 | Wang et al. |
| 2002/0117103 A1 | 8/2002 | Hooper et al. |
| 2002/0121637 A1 | 9/2002 | Ito |
| 2002/0123204 A1 | 9/2002 | Torvik et al. |
| 2002/0130327 A1 | 9/2002 | Wu et al. |
| 2002/0131726 A1 | 9/2002 | Lin et al. |
| 2002/0141006 A1 | 10/2002 | Pocius et al. |
| 2002/0158578 A1 | 10/2002 | Eliashevich et al. |
| 2002/0171087 A1 | 11/2002 | Krames et al. |
| 2003/0010975 A1 | 1/2003 | Gibb |
| 2003/0015959 A1 | 1/2003 | Tomoda et al. |
| 2003/0039119 A1 | 2/2003 | Cao |
| 2003/0075723 A1 | 4/2003 | Heremans et al. |
| 2003/0100140 A1 | 5/2003 | Lin et al. |
| 2003/0124754 A1 | 7/2003 | Farahi et al. |
| 2003/0141506 A1 | 7/2003 | Sano |
| 2003/0145885 A1 | 8/2003 | Kang et al. |
| 2003/0213969 A1 | 11/2003 | Wang et al. |
| 2003/0215766 A1 | 11/2003 | Fischer et al. |
| 2004/0004434 A1 | 1/2004 | Nishi et al. |
| 2004/0007709 A1 | 1/2004 | Kondo |
| 2004/0012027 A1 | 1/2004 | Keller et al. |
| 2004/0012958 A1 | 1/2004 | Hashimoto et al. |
| 2004/0036074 A1 | 2/2004 | Kondo |
| 2004/0046179 A1 | 3/2004 | Johannes et al. |
| 2004/0070014 A1 | 4/2004 | Lin |
| 2004/0079408 A1 | 4/2004 | Fetzer et al. |
| 2004/0089868 A1 | 5/2004 | Hon et al. |
| 2004/0094772 A1 | 5/2004 | Hon et al. |
| 2004/0095502 A1 | 5/2004 | Losehand |
| 2004/0155565 A1 | 8/2004 | Holder |
| 2004/0164311 A1 | 8/2004 | Uemura |
| 2004/0173810 A1 | 9/2004 | Lin |
| 2004/0184495 A1 | 9/2004 | Kondo |
| 2004/0188689 A1 | 9/2004 | Shono et al. |
| 2004/0188700 A1 | 9/2004 | Fukasawa et al. |
| 2004/0188791 A1 | 9/2004 | Horng et al. |
| 2004/0211970 A1 | 10/2004 | Hayashimoto et al. |
| 2004/0227148 A1 | 11/2004 | Camras et al. |
| 2004/0239611 A1 | 12/2004 | Huang et al. |
| 2004/0245531 A1 | 12/2004 | Fuii et al. |
| 2004/0257797 A1 | 12/2004 | Suehiro et al. |
| 2004/0263064 A1 | 12/2004 | Huang |
| 2005/0029528 A1 | 2/2005 | Ishikawa |
| 2005/0032257 A1 | 2/2005 | Camras et al. |
| 2005/0035354 A1 | 2/2005 | Lin et al. |
| 2005/0040410 A1 | 2/2005 | Ledentsov et al. |
| 2005/0062830 A1 | 3/2005 | Taki et al. |
| 2005/0077532 A1 | 4/2005 | Ota et al. |
| 2005/0082562 A1 | 4/2005 | Ou et al. |
| 2005/0093008 A1 | 5/2005 | Suehiro et al. |
| 2005/0110032 A1 | 5/2005 | Saito et al. |
| 2005/0111240 A1 | 5/2005 | Yonekubo |
| 2005/0121688 A1 | 6/2005 | Nagai et al. |
| 2005/0133810 A1 | 6/2005 | Roberts et al. |
| 2005/0145864 A1 | 7/2005 | Sugiyama et al. |
| 2005/0145865 A1 | 7/2005 | Okuyama et al. |
| 2005/0156510 A1 | 7/2005 | Chua et al. |
| 2005/0161779 A1 | 7/2005 | Peng et al. |
| 2005/0184300 A1 | 8/2005 | Tazima et al. |
| 2005/0189551 A1 | 9/2005 | Peng et al. |
| 2005/0189555 A1 | 9/2005 | Lin et al. |
| 2005/0194598 A1 | 9/2005 | Kim et al. |
| 2005/0196887 A1 | 9/2005 | Liu |
| 2005/0205884 A1 | 9/2005 | Kim et al. |
| 2005/0205887 A1 | 9/2005 | Shei |
| 2005/0211997 A1 | 9/2005 | Suehiro et al. |
| 2005/0212002 A1 | 9/2005 | Sanga et al. |
| 2005/0218790 A1 | 10/2005 | Blumel |
| 2005/0224830 A1 | 10/2005 | Blonder et al. |
| 2005/0243570 A1 | 11/2005 | Chaves et al. |
| 2005/0248271 A1 | 11/2005 | Ng et al. |
| 2005/0265404 A1 | 12/2005 | Ashdown |
| 2005/0274956 A1 | 12/2005 | Bhat |
| 2005/0274970 A1 | 12/2005 | Ludowise |
| 2006/0000964 A1 | 1/2006 | Ye et al. |
| 2006/0001035 A1 | 1/2006 | Suehiro et al. |
| 2006/0001036 A1 | 1/2006 | Jacob et al. |
| 2006/0006408 A1 | 1/2006 | Suehiro et al. |
| 2006/0008941 A1 | 1/2006 | Haskell et al. |
| 2006/0009006 A1 | 1/2006 | Murai et al. |
| 2006/0012299 A1 | 1/2006 | Suehiro et al. |
| 2006/0017055 A1 | 1/2006 | Cropper et al. |
| 2006/0022214 A1 | 2/2006 | Morgan et al. |
| 2006/0038187 A1 | 2/2006 | Ueno |
| 2006/0043399 A1 | 3/2006 | Miyagaki et al. |
| 2006/0054905 A1 | 3/2006 | Schwach et al. |
| 2006/0063028 A1 | 3/2006 | Leurs |
| 2006/0091376 A1 | 5/2006 | Kim et al. |
| 2006/0091788 A1 | 5/2006 | Yan |
| 2006/0125385 A1 | 6/2006 | Lu et al. |
| 2006/0138439 A1 | 6/2006 | Bogner et al. |
| 2006/0145170 A1 | 7/2006 | Cho |
| 2006/0154392 A1 | 7/2006 | Tran et al. |
| 2006/0163586 A1 | 7/2006 | Denbaars et al. |
| 2006/0163601 A1 | 7/2006 | Harle et al. |
| 2006/0164836 A1 | 7/2006 | Suehiro |
| 2006/0171152 A1 | 8/2006 | Suehiro et al. |
| 2006/0175624 A1 | 8/2006 | Sharma et al. |
| 2006/0175625 A1 | 8/2006 | Yokotani et al. |
| 2006/0186418 A1 | 8/2006 | Edmond et al. |
| 2006/0186424 A1 | 8/2006 | Fujimoto et al. |
| 2006/0189026 A1 | 8/2006 | Cropper et al. |
| 2006/0192217 A1 | 8/2006 | David et al. |
| 2006/0194359 A1 | 8/2006 | Weisbuch et al. |
| 2006/0194363 A1 | 8/2006 | Giesberg et al. |
| 2006/0202219 A1 | 9/2006 | Ohashi et al. |
| 2006/0202226 A1 | 9/2006 | Weisbuch et al. |
| 2006/0233969 A1 | 10/2006 | White et al. |
| 2006/0234486 A1 | 10/2006 | Speck et al. |
| 2006/0237732 A1 | 10/2006 | Nagai et al. |
| 2006/0239006 A1 | 10/2006 | Chaves et al. |
| 2006/0243993 A1 | 11/2006 | Yu |
| 2006/0246722 A1 | 11/2006 | Speck et al. |
| 2006/0267026 A1 | 11/2006 | Kim et al. |
| 2006/0273336 A1 | 12/2006 | Fujikura et al. |
| 2006/0273343 A1 | 12/2006 | Nakahata et al. |
| 2006/0289892 A1 | 12/2006 | Lee |
| 2007/0001185 A1 | 1/2007 | Lu et al. |
| 2007/0001186 A1 | 1/2007 | Murai et al. |
| 2007/0001591 A1 | 1/2007 | Tanaka |
| 2007/0012931 A1 | 1/2007 | Lee et al. |
| 2007/0012940 A1 | 1/2007 | Suh et al. |
| 2007/0019409 A1 | 1/2007 | Nawashiro et al. |
| 2007/0029560 A1 | 2/2007 | Su |
| 2007/0057624 A1 | 3/2007 | Angelopoulos et al. |
| 2007/0065960 A1 | 3/2007 | Fukshima et al. |
| 2007/0072324 A1 | 3/2007 | Krames et al. |
| 2007/0085075 A1 | 4/2007 | Yamazaki et al. |
| 2007/0085100 A1 | 4/2007 | Diana et al. |
| 2007/0102721 A1 | 5/2007 | Denbaars et al. |
| 2007/0114549 A1 | 5/2007 | Yu |
| 2007/0120135 A1 | 5/2007 | Soules et al. |
| 2007/0121690 A1 | 5/2007 | Fujii et al. |
| 2007/0125995 A1 | 6/2007 | Weisbuch et al. |
| 2007/0139949 A1 | 6/2007 | Tanda et al. |
| 2007/0145397 A1 | 6/2007 | Denbaars et al. |
| 2007/0147072 A1 | 6/2007 | Scobbo et al. |
| 2007/0189013 A1 | 8/2007 | Ford |
| 2007/0252164 A1 | 11/2007 | Zhong et al. |
| 2007/0257267 A1 | 11/2007 | Leatherdale |
| 2007/0257271 A1 | 11/2007 | Ouderkirk |
| 2007/0284603 A1 | 12/2007 | Haase |
| 2007/0290224 A1 | 12/2007 | Ogawa |

(56) References Cited

U.S. PATENT DOCUMENTS

| | | |
|---|---|---|
| 2008/0012034 A1 | 1/2008 | Thielen et al. |
| 2008/0030691 A1 | 2/2008 | Godo |
| 2008/0030974 A1 | 2/2008 | Abu-Ageel |
| 2008/0087900 A1 | 4/2008 | Yang |
| 2008/0101086 A1 | 5/2008 | Lee |
| 2008/0111146 A1 | 5/2008 | Nakamura |
| 2008/0121918 A1 | 5/2008 | Denbaars et al. |
| 2008/0128730 A1 | 6/2008 | Fellows et al. |
| 2008/0128731 A1 | 6/2008 | Denbaars et al. |
| 2008/0135864 A1 | 6/2008 | David et al. |
| 2008/0149949 A1 | 6/2008 | Nakamura et al. |
| 2008/0149959 A1 | 6/2008 | Nakamura et al. |
| 2008/0169752 A1 | 7/2008 | Hattori et al. |
| 2008/0182420 A1 | 7/2008 | Hu et al. |
| 2008/0191191 A1 | 8/2008 | Kim |
| 2008/0191224 A1 | 8/2008 | Emerson et al. |
| 2008/0245949 A1 | 10/2008 | Morimoto et al. |
| 2008/0251809 A1 | 10/2008 | Wolf et al. |
| 2009/0039267 A1 | 2/2009 | Iso et al. |
| 2009/0039762 A1 | 2/2009 | Park et al. |
| 2009/0078951 A1 | 3/2009 | Miki et al. |
| 2009/0114928 A1 | 5/2009 | Messere et al. |
| 2009/0121250 A1 | 5/2009 | Denbaars et al. |
| 2009/0140630 A1 | 6/2009 | Kijima et al. |
| 2009/0146170 A1 | 6/2009 | Zhong et al. |
| 2009/0315055 A1 | 12/2009 | Tamboli et al. |
| 2010/0059787 A1 | 3/2010 | Hoshina et al. |
| 2010/0090240 A1 | 4/2010 | Tamboli et al. |
| 2010/0187555 A1 | 7/2010 | Murai et al. |
| 2010/0264434 A1 | 10/2010 | Pioessl et al. |
| 2010/0283078 A1 | 11/2010 | Denbaars et al. |
| 2010/0289043 A1 | 11/2010 | Aurelien et al. |
| 2011/0079806 A1 | 4/2011 | Hsu et al. |
| 2011/0089455 A1 | 4/2011 | Diana et al. |
| 2011/0193061 A1 | 8/2011 | Hsu |
| 2012/0043568 A1 | 2/2012 | Yan |
| 2012/0056158 A1 | 3/2012 | Iso et al. |
| 2012/0161180 A1 | 6/2012 | Komatsu et al. |
| 2013/0020602 A1 | 1/2013 | Nakamura et al. |
| 2014/0252396 A1 | 9/2014 | Fujii et al. |
| 2014/0292618 A1 | 10/2014 | Yamazaki et al. |
| 2014/0353707 A1 | 12/2014 | Nakamura et al. |
| 2015/0014732 A1 | 1/2015 | Fellows Demille et al. |
| 2015/0102378 A1 | 4/2015 | Huang et al. |
| 2015/0270444 A1 | 9/2015 | Liu |
| 2016/0133790 A1 | 5/2016 | Fellows Demille et al. |
| 2018/0190888 A1 | 7/2018 | Kim |

FOREIGN PATENT DOCUMENTS

| | | |
|---|---|---|
| AU | 2010257325 B2 | 12/2011 |
| DE | 19807758 | 12/1998 |
| DE | 10245932 B3 | 2/2004 |
| DE | 10361801 A1 | 8/2005 |
| DE | 102004028143 B4 | 12/2006 |
| DE | 19807758 B4 | 8/2008 |
| DE | 112007000313 T5 | 7/2009 |
| EP | 1081771 | 3/2001 |
| EP | 1213773 | 6/2002 |
| EP | 1213773 A1 | 6/2002 |
| EP | 1416543 | 5/2004 |
| EP | 1536487 | 6/2005 |
| EP | 2087563 | 8/2009 |
| EP | 2174351 | 4/2010 |
| EP | 1081771 B1 | 6/2011 |
| EP | 2843716 | 3/2015 |
| FR | 2858859 A1 | 2/2005 |
| GB | 2371679 A | 7/2002 |
| GB | 2413698 A | 11/2005 |
| JP | 53024300 | 3/1978 |
| JP | S5324300 A | 3/1978 |
| JP | 09018057 | 1/1997 |
| JP | 09027642 | 1/1997 |
| JP | H0927642 A | 1/1997 |
| JP | 09055540 | 2/1997 |
| JP | H0955540 A | 2/1997 |
| JP | 10200165 | 7/1998 |
| JP | H10200165 A | 7/1998 |
| JP | H11-17223 | 1/1999 |
| JP | 2000277808 | 10/2000 |
| JP | 2000277808 A | 10/2000 |
| JP | 2001024223 | 1/2001 |
| JP | 2001044491 | 2/2001 |
| JP | 2001068731 | 3/2001 |
| JP | 2001068731 A | 3/2001 |
| JP | 2001111112 | 4/2001 |
| JP | 3172947 | 5/2001 |
| JP | 2001126515 | 5/2001 |
| JP | 2001126515 A | 5/2001 |
| JP | 2002084002 A | 3/2002 |
| JP | 2002208735 | 7/2002 |
| JP | 2002208735 A | 7/2002 |
| JP | 2002232020 | 8/2002 |
| JP | 2002280614 | 9/2002 |
| JP | 2002280614 A | 9/2002 |
| JP | 2002314152 | 10/2002 |
| JP | 2002319708 | 10/2002 |
| JP | 2003011417 A | 1/2003 |
| JP | 2003016808 | 1/2003 |
| JP | 2003017740 | 1/2003 |
| JP | 2003069085 | 3/2003 |
| JP | 2003069085 A | 3/2003 |
| JP | 2003249692 | 9/2003 |
| JP | 2003249692 A | 9/2003 |
| JP | 2003264317 | 9/2003 |
| JP | 2003318441 | 11/2003 |
| JP | 2003318441 A | 11/2003 |
| JP | 2003347586 | 12/2003 |
| JP | 2004111981 | 4/2004 |
| JP | 2004111981 A | 4/2004 |
| JP | 2004158557 | 6/2004 |
| JP | 2004521498 | 7/2004 |
| JP | 2004296999 A | 10/2004 |
| JP | 2005056922 | 3/2005 |
| JP | 2005057310 | 3/2005 |
| JP | 2005093102 | 4/2005 |
| JP | 2005093102 A | 4/2005 |
| JP | 2005117006 | 4/2005 |
| JP | 2005150261 | 6/2005 |
| JP | 2005191197 | 7/2005 |
| JP | 2005191197 A | 7/2005 |
| JP | 2005191514 | 7/2005 |
| JP | 2005191514 A | 7/2005 |
| JP | 2005267926 | 9/2005 |
| JP | 2005267926 A | 9/2005 |
| JP | 2005268323 | 9/2005 |
| JP | 2005326757 | 11/2005 |
| JP | 2005347677 | 12/2005 |
| JP | 2005347677 A | 12/2005 |
| JP | 2005353816 | 12/2005 |
| JP | 2006012916 | 1/2006 |
| JP | 2006024615 A | 1/2006 |
| JP | 2006024616 | 1/2006 |
| JP | 2006032387 | 2/2006 |
| JP | 2006032387 A | 2/2006 |
| JP | 2006041479 | 2/2006 |
| JP | 2006041479 A | 2/2006 |
| JP | 2006060034 A | 3/2006 |
| JP | 2006073618 | 3/2006 |
| JP | 2006128227 | 5/2006 |
| JP | 2006156590 | 6/2006 |
| JP | 2006165326 | 6/2006 |
| JP | 2006191103 | 7/2006 |
| JP | 2006210824 | 8/2006 |
| JP | 2006229259 | 8/2006 |
| JP | 2006237264 | 9/2006 |
| JP | 2006237264 A | 9/2006 |
| JP | 2006261688 A | 9/2006 |
| JP | 2006287113 | 10/2006 |
| JP | 2006294907 | 10/2006 |
| JP | 2006303258 | 11/2006 |
| JP | 2007165811 | 6/2007 |
| JP | 2007324220 | 12/2007 |
| JP | 2010510659 | 4/2010 |

(56) References Cited

FOREIGN PATENT DOCUMENTS

| | | |
|---|---|---|
| JP | 2010512662 | 4/2010 |
| JP | 2010534943 | 11/2010 |
| JP | 2014187397 | 10/2014 |
| KR | 200403690 Y1 | 12/2005 |
| KR | 100619441 B1 | 9/2006 |
| KR | 100626365 | 9/2006 |
| KR | 100626365 B1 | 9/2006 |
| KR | 100643582 B1 | 11/2006 |
| KR | 100715580 B1 | 5/2007 |
| KR | 100733903 B1 | 7/2007 |
| KR | 100786798 B1 | 12/2007 |
| KR | 100796670 B1 | 1/2008 |
| KR | 100808705 B1 | 2/2008 |
| KR | 100828174 B1 | 5/2008 |
| KR | 100840637 B1 | 6/2008 |
| KR | 20100059820 | 6/2010 |
| SG | 100618 A1 | 12/2003 |
| TW | 586096 B | 5/2004 |
| TW | M293524 | 7/2006 |
| TW | 200830593 | 7/2008 |
| TW | 200843144 | 11/2008 |
| TW | 200924239 | 6/2009 |
| TW | I460881 | 11/2014 |
| TW | 201448263 | 12/2014 |
| WO | 2002090825 A1 | 11/2002 |
| WO | WO 2002090825 | 11/2002 |
| WO | WO 2004061969 | 7/2004 |
| WO | 2005064666 A1 | 7/2005 |
| WO | WO 2005064666 | 7/2005 |
| WO | WO 2005083037 | 9/2005 |
| WO | 2006098545 A2 | 9/2006 |
| WO | WO 2007036198 | 4/2007 |
| WO | WO 2007067758 | 6/2007 |
| WO | WO 2008060586 | 5/2008 |
| WO | WO 2008060615 | 5/2008 |
| WO | WO 2008073400 | 6/2008 |
| WO | WO 2009015386 | 1/2009 |

OTHER PUBLICATIONS

Jasinski, J. et al., "Microstructure of GaAs/GaN interfaces produced by direct wafer fusion," Appl. Phys. Lett., Oct. 21, 2002, pp. 3152-3154, vol. 81, No. 17.

Kish, F.A. et al., "Very high-efficiency semiconductor wafer-bonded transparent-substrate (AlxGz1-x)0.5In0.5P/GaP light-emitting diodes," Appl. Phys. Lett., 23 May 1994, pp. 2839-2841, vol. 64, No. 21.

Liau, Z.L. et al., "Wafer fusion: A novel technique for optoelectronic device fabrication and monolithic integration," Appl. Phys. Lett., Feb. 19, 1990, pp. 737-739, vol. 56, No. 8.

Murai, A. et al., "Wafer Bonding of GaN and ZnSSe for Optoelectronic Applications," Jpn. J. Appl. Phys., 2004, pp. L1275-L1277, vol. 43, No. 10A.

Nakahara, K. et al., "Improved External Efficiency InGaN-Based Light-Emitting Diodes with Transparent Conductive Ga-Doped ZnO as p-Electrodes," Jpn. J. Appl. Phys., 2004, pp. L180-L182, vol. 43, No. 2A.

Nakamura, S. et al., "High-Brightness InGaN Blue, Green and Yellow Light-Emitting Diodes with Quantum Well Structures," Jpn. J. Appl. Phys., Jul. 1, 1995, pp. L797-L799, vol. 34, Part 2, No. 7A.

Narukawa, Y. et al., "Ultra-High Efficiency White Light Emitting Diodes," Jpn. J. Appl. Phys., 2006, pp. L1084-L1086, vol. 45, No. 41.

PCT/US2006/023588 International Search Report and Written Opinion dated Jun. 16, 2006.

PCT/US2006/043317 International Search Report and Written Opinion dated Nov. 6, 2006.

PCT/US2007/025278 International Search Report and Written Opinion dated Apr. 3, 2008.

PCT/US2007/024062 International Search Report and Written Opinion dated Apr. 22, 2008.

PCT/US2007/023972 International Search Report and Written Opinion dated May 23, 2008.

PCT/US2008/071362 International Search Report and Written Opinion dated Sep. 22, 2008.

EP 06837048.5 Extended Search Report dated Dec. 1, 2010.

EP 07862038.2 Extended Search Report dated Jan. 6, 2012.

EP 14177879.5 Extended Search Report dated Mar. 27, 2015.

Carlin et al., High Quality AllnN for High Index Contrast Bragg Mirrors Lattice Matched to GaN, Applied Physics Letters, 2003, vol. 83(4).

Kawakami et al., Dimensionality of Excitons in InGaN-Based Light Emitting Devices, Phys, Stat. Sol., (a), 2000, vol. 178, pp. 331-336.

Murai et al., Hexagonal Pyramid shaped light-emitting diodes based on ZnO and GaN direct wafer bonding, Applied Physics Letters, 2006, vol. 89(17) pp. 17116-1-17116-3.

Nishida et al., Efficient and High-Power AIGaN-Based Ultraviolet Light-Emitting Diode Grown on Bulk GaN, Appl. Phys., Lett., 2001, vol. 79(6) pp. 711-712.

Oshima et al., Growth of the 2-in-Size Bulk ZnO Single Crystals by the Hydrothermal Method, J. of Crystal Growth, 2004, vol. 260, pp. 166-170.

Sink et al., Cleaved GaN Facets by Wafer Fusion of GaN to InP, Applied Physics Letter, 1996, vol. 68(15).

Smathers et al., Nanometer Scale Surface Clustering on ZnSe Epilayers, Applied Physics Letters, 1998, vol. 72(10).

Someya et al., High Reflective GaN/AI0.34Ga0.66N Quarter-Wave Reflectors Grown by Metal Organic Chemical Vapor Deposition, Applied Physics Letter, 1998, vol. 73(25).

A.A. Bergh and P.J. Dean. Light-emitting diodes. Clarendon Press—Oxford. 1976.

Adachi S. "Properties of Gallium Arsenide" EMIS Data review Ser. 2 513 INSPEC (IEEE New York 1990).

Fujii, T. et al. Increase in the extraction efficiency of GaN-based light-emitting diodes via surface roughening. Appl. Phys. Lett., Feb. 9, 2004, pp. 855-857, vol. 84, No. 6.

Hoefler G. E., Vanderwater D. A., DeFevere D. C., Kish F. A., Camras M. D., Steranka F M., and Tan I.-H. (1996) "Wafer bonding of 50-mm diameter GaP to AlGaInP—GaP light-emitting diode wafers" Appl. Phys. Lett. 69, 803.

Kish F. A., Steranka F. M., DeFevere D. C., Vanderwater D. A., Park K. G., Kuo C. P., Osentowski T. D., Peanasky M. J., Yu J. G., Fletcher R. M., Steigerwald D. A., Craford M. G., and Robbins V. M. "Very high-efficiency semiconductor wafer-bonded transparent substrate (AlxGa1—x)0.5In0.5P/GaP light-emitting diodes" Appl. Phys. Lett. 64, 2839 (1994).

Kish F. A., Vanderwater D. A., Peanasky M. J., Ludowise M. J., Hummel S. G., and Rosner S. J. "Low-resistance ohmic conduction across compound semiconductor wafer-bonded interfaces" Appl. Phys. Lett. 67, 2060 (1995).

Nakahara, K. et al., "Improved External Efficiency InGaN-Based Light-Emitting Diodes with Transparent Conductive Ga-Doped Zn0 as p-Electrodes," Jpn. J. Appl. Phys., 2004, pp. L180-L182, vol. 43.

Narukawa, Y. et al., "Ultra-High Efficiency White Light Emitting Diodes," Jpn. J. Appl. Phys., 2006, pp. L1084-L1086, vol. 45.

Noctron seeks Chinese partners to make innovative LED products (Aug. 2006)—News—LEDs Magazine.

Orita, S. Tamura, T. Takizawa, T. Ueda, M. Yuri, S. Takigawa, D. Ueda, Jpn. J. Appl. Phys. 43, 5809 (2004).

Tadatomo, H. Okagawa, Y. Ohuchi, T. Tsunekawa, T. Jyouichi, Y. Imada, M. Kato, H. Kudo, T. Taguchi, Phys. Status Solidi A 188, 121-125 (2001).

Yamada, T. Mitani, Y. Narukawa, S. Shioji, I. Niki, S. Sonobe, K. Deguchi, M. Sano, T. Mukai, Jpn. J. Appl. Phys. 41, L1431 (2002).

"Noctron seeks Chinese partners to make innovative LED products," LEDs Magazine, Aug. 2006, https://web.archive.org/web/20061017131530/http://ledsmagazine.com/articles/news/3/8/23/1, pp. 1-2.

Han, D-S., et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, pp. 1406-1408, vol. 18, No. 13.

Schubert, E.F., Light-Emitting Diodes, 2003, p. 149, Cambridge University Press.

(56) References Cited

OTHER PUBLICATIONS

Stringfellow, G.B., et al., High Brightness Light Emitting Diodes, Semiconductors and Semimetals, 1997, pp. 176-177, 338-339, vol. 48, Academic Press.
Pankove, J.I., et al., Gallium Nitride (GaN) II, Semiconductors and Semimetals, 1999, p. 339, vol. 57, Academic Press.
Cuong, T. V., et al., "Calculation of the external quantum efficiency of light emitting diodes with different chip designs," Phys. Stat. Sol. (c), 2004, pp. 2433-2437, vol. 1, No. 10.

\* cited by examiner

CONVENTIONAL LED

CONVENTIONAL LED

CONVENTIONAL LED

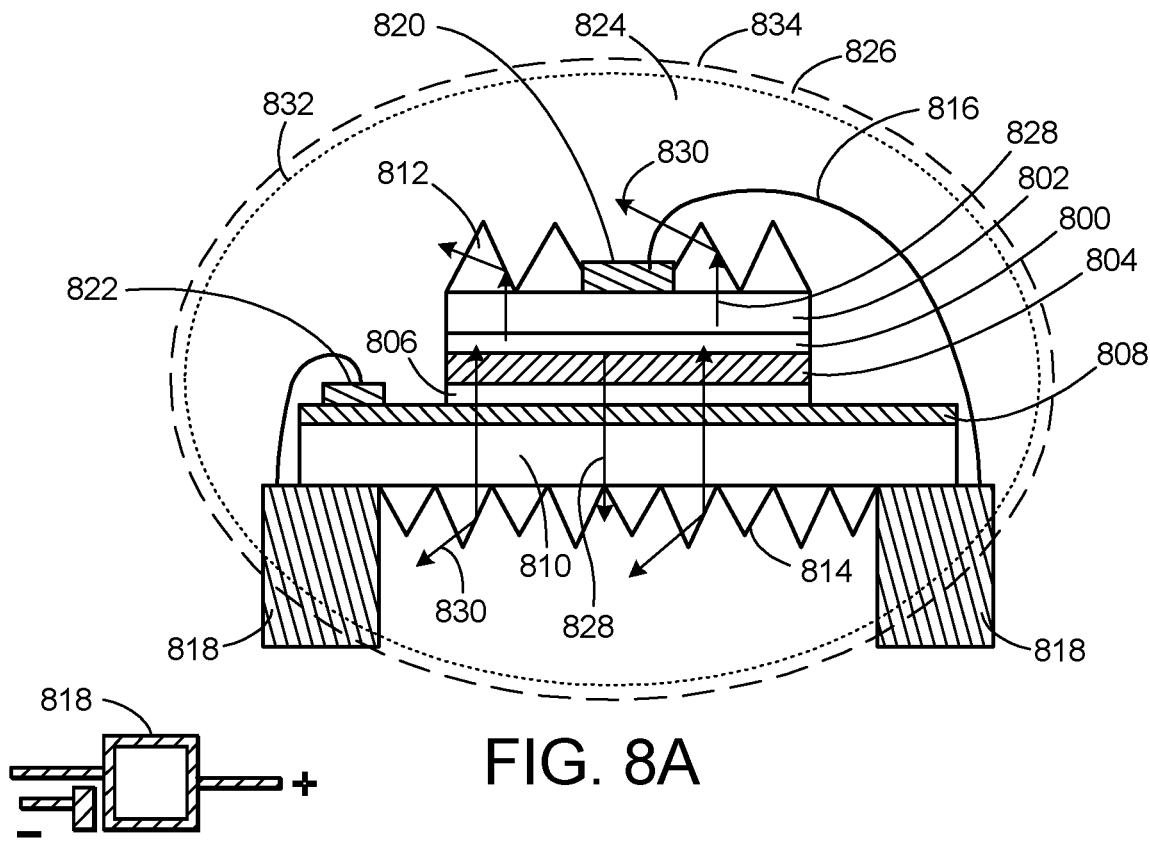
FIG. 8A
FIG. 8B
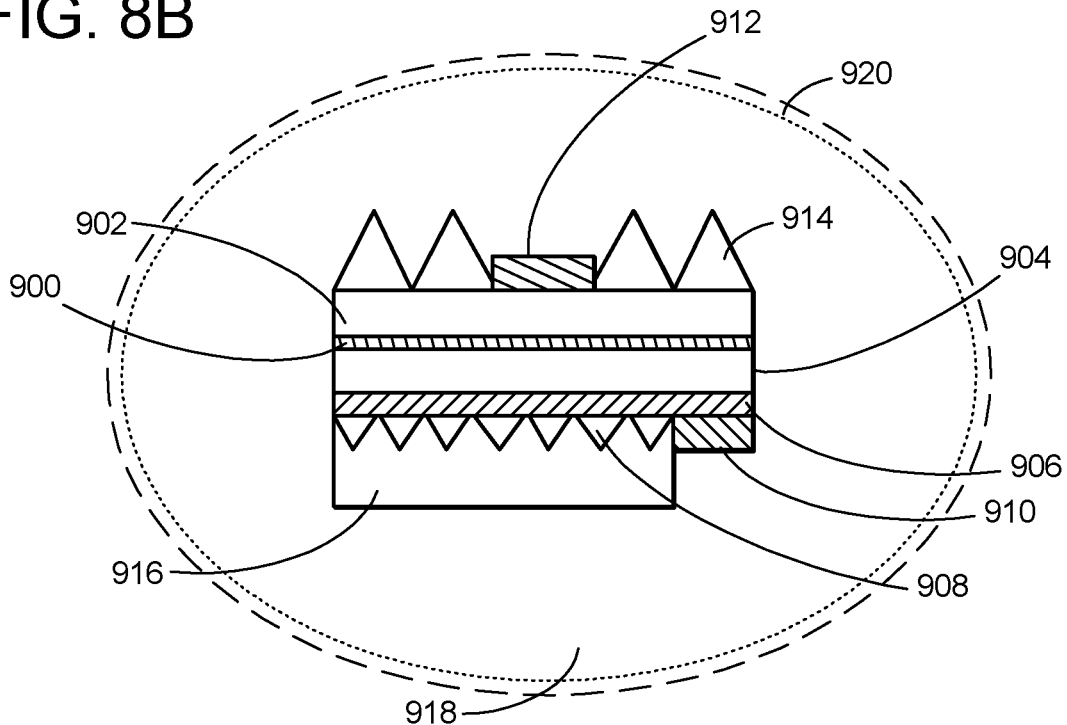
FIG. 9

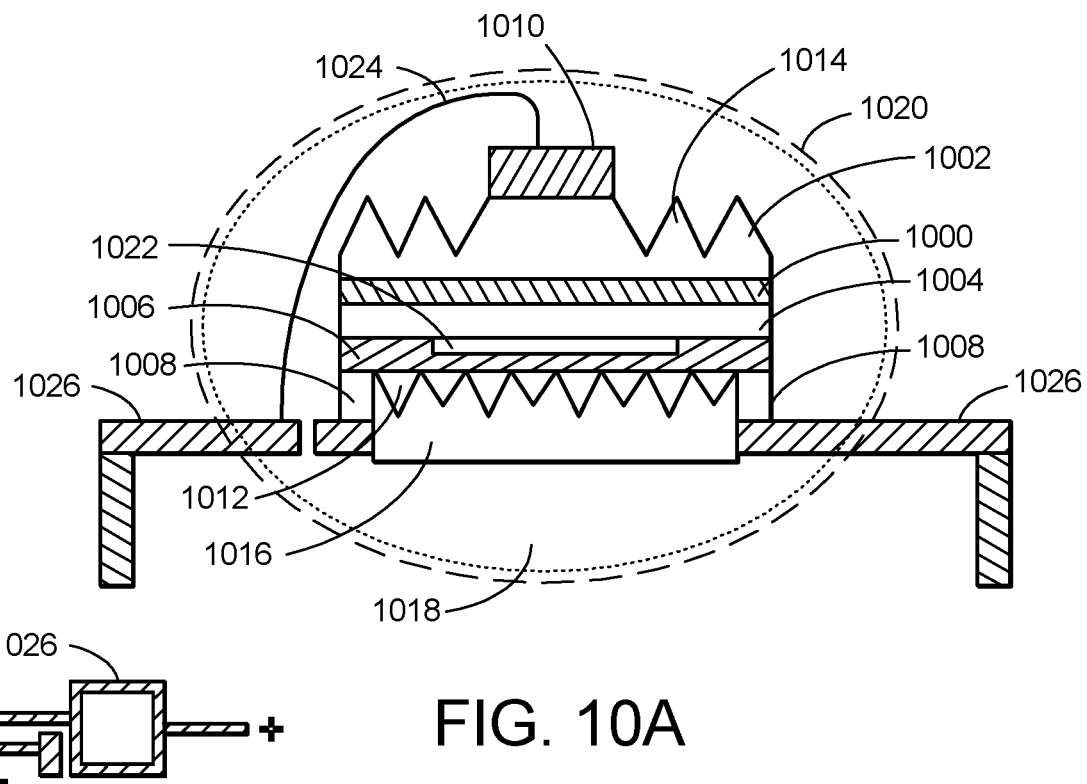
FIG. 10A
FIG. 10B
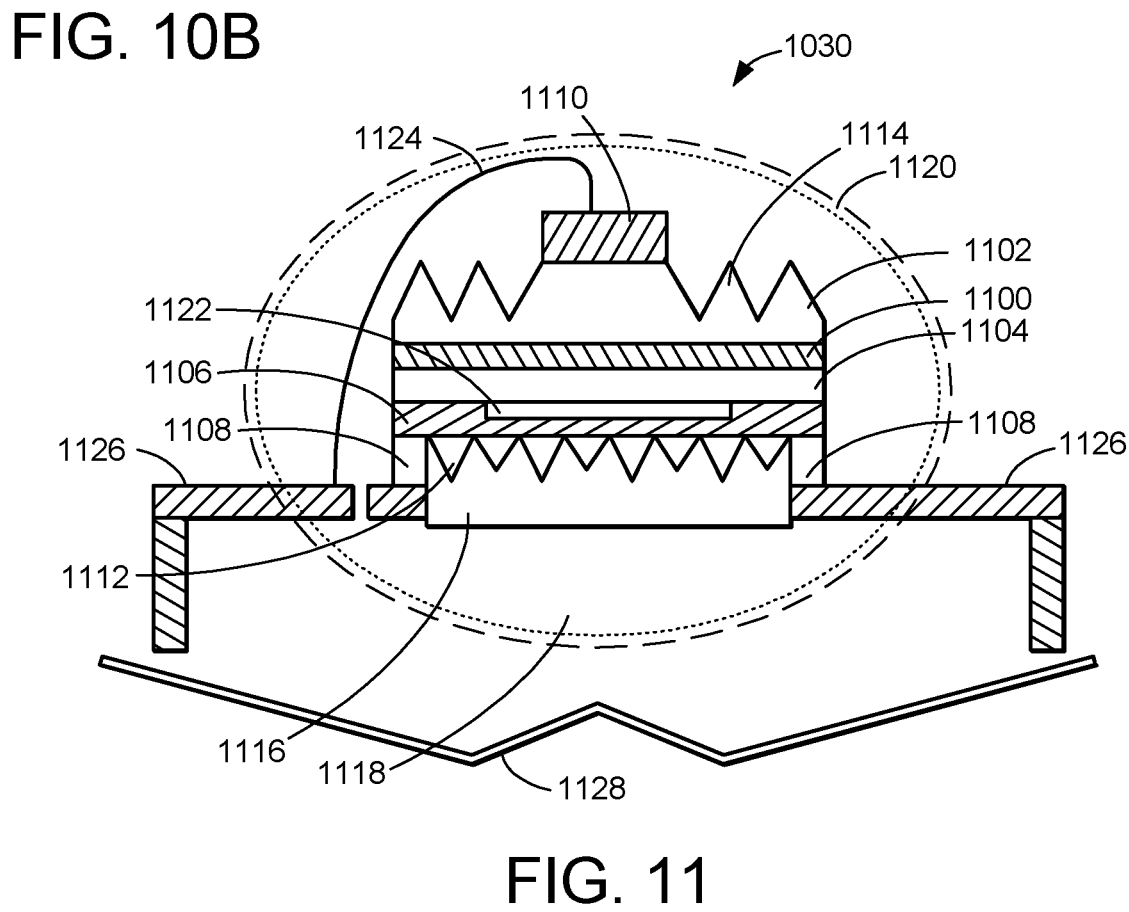
FIG. 11

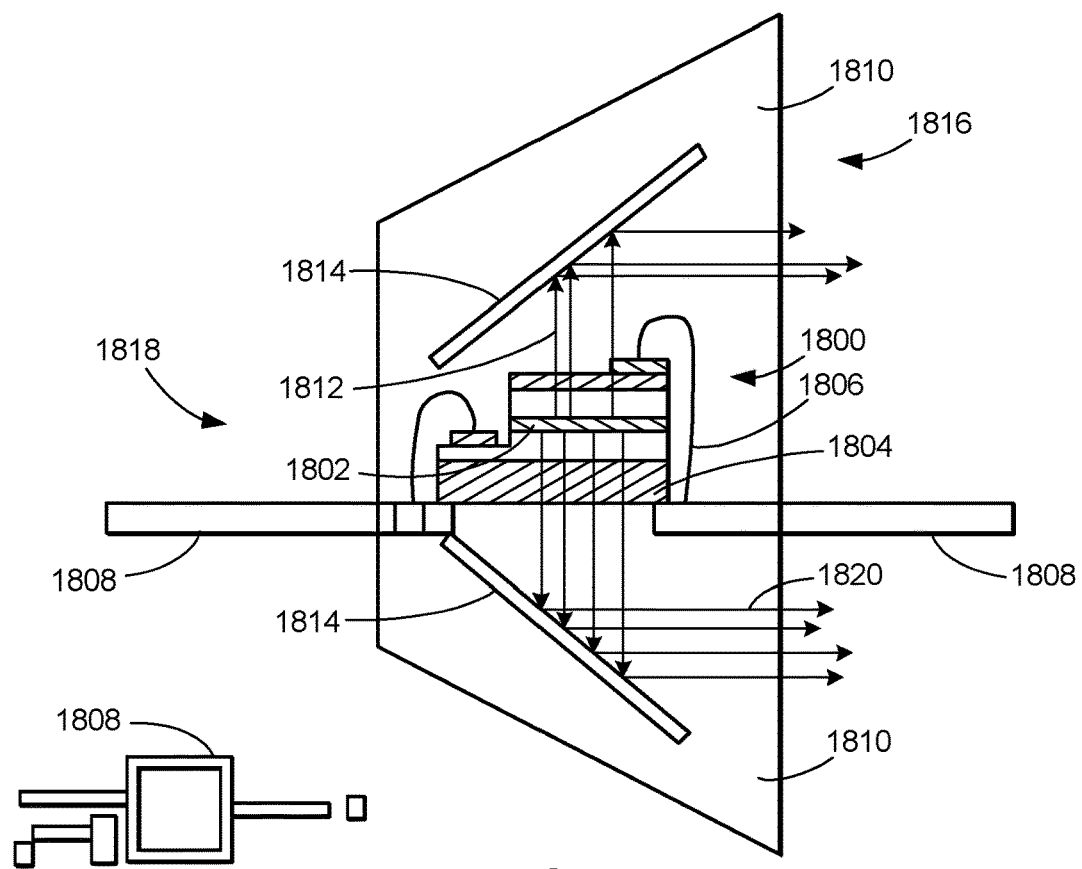
FIG. 18A
FIG. 18B
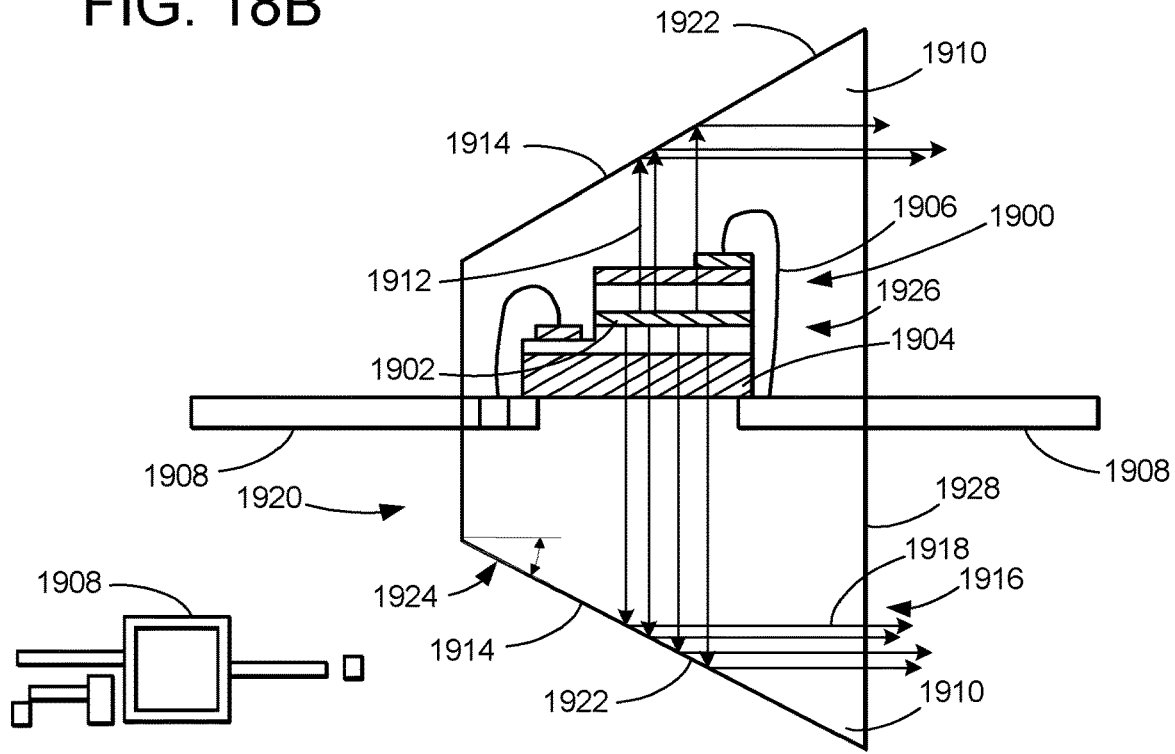
FIG. 19B
FIG. 19A

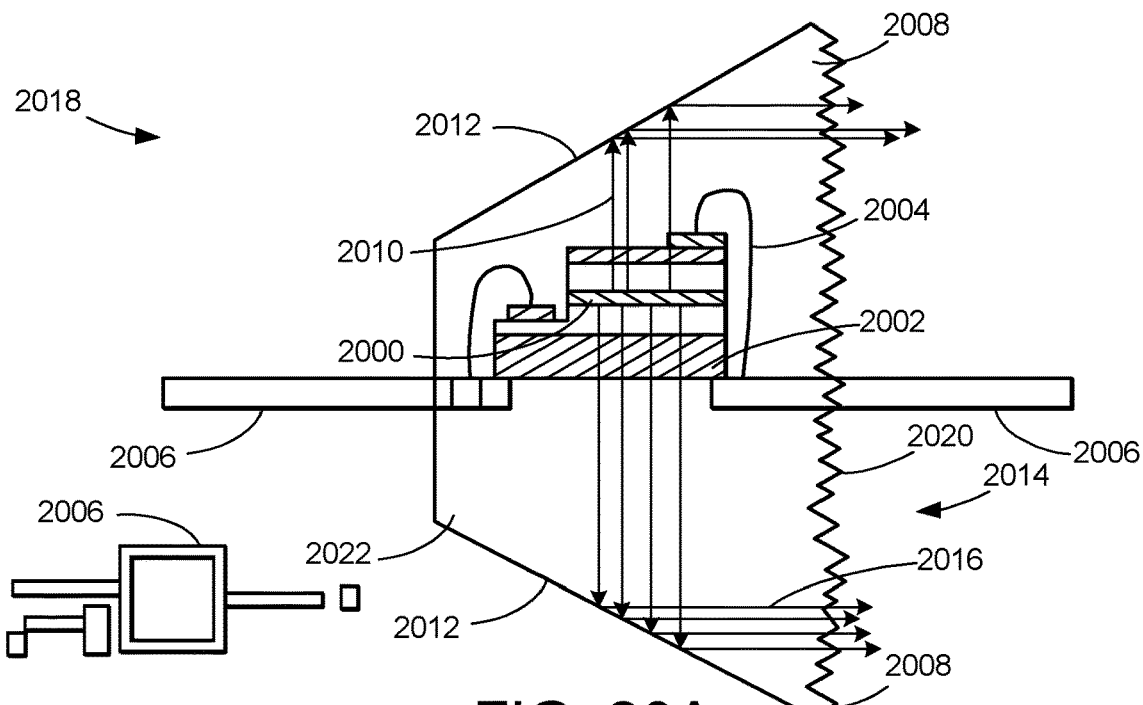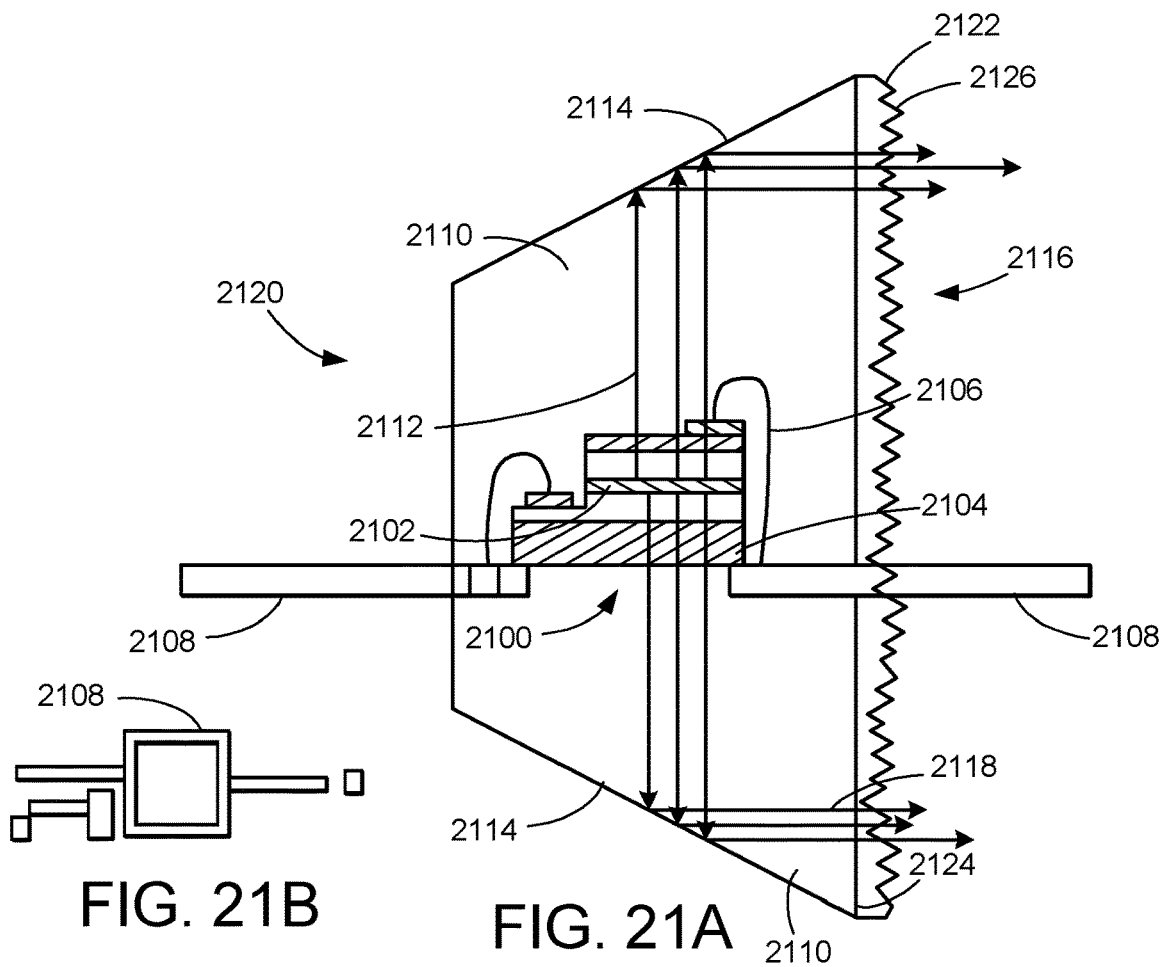

TRANSPARENT LIGHT EMITTING DEVICE WITH LIGHT EMITTING DIODES

CROSS-REFERENCE TO RELATED APPLICATIONS

This application is a continuation under 35 U.S.C. § 120 of:

U.S. Utility patent application Ser. No. 16/569,120, filed on Sep. 12, 2019, by Shuji Nakamura, Steven P. DenBaars, and Hirokuni Asamizu, entitled, "TRANSPARENT LIGHT EMITTING DEVICE WITH LIGHT EMITTING DIODES," which application is a continuation under 35 U.S.C. § 120 of:

U.S. Utility patent application Ser. No. 16/567,275, filed on Sep. 11, 2019, by Shuji Nakamura, Steven P. DenBaars, and Hirokuni Asamizu, entitled, "FILAMENT LED LIGHT BULB," which application is a continuation under 35 U.S.C. § 120 of:

U.S. Utility patent application Ser. No. 16/422,323, filed on May 24, 2019, by Shuji Nakamura, Steven P. DenBaars, and Hirokuni Asamizu, entitled, "TRANSPARENT LIGHT EMITTING DIODES," now U.S. Pat. No. 10,454,010, issued Oct. 22, 2019, which application is a continuation under 35 U.S.C. § 120 of:

U.S. Utility patent application Ser. No. 16/238,736, filed on Jan. 3, 2019, by Shuji Nakamura, Steven P. DenBaars, and Hirokuni Asamizu, entitled, "TRANSPARENT LIGHT EMITTING DIODES," which application is a continuation under 35 U.S.C. § 120 of:

U.S. Utility patent application Ser. No. 14/461,151, filed on Aug. 15, 2014, by Shuji Nakamura, Steven P. DenBaars, and Hirokuni Asamizu, entitled, "TRANSPARENT LIGHT EMITTING DIODES," now U.S. Pat. No. 10,217,916, issued Feb. 26, 2019, which application is a continuation under 35 U.S.C. § 120 of:

U.S. Utility patent application Ser. No. 13/622,884, filed on Sep. 19, 2012, by Shuji Nakamura, Steven P. DenBaars, and Hirokuni Asamizu, entitled, "TRANSPARENT LIGHT EMITTING DIODES," now U.S. Pat. No. 8,835,959, issued Sep. 16, 2014, which application is a continuation under 35 U.S.C. § 120 of:

U.S. Utility patent application Ser. No. 11/954,154, filed on Dec. 11, 2007, by Shuji Nakamura, Steven P. DenBaars, and Hirokuni Asamizu, entitled, "TRANSPARENT LIGHT EMITTING DIODES," now U.S. Pat. No. 8,294,166, issued Oct. 23, 2012, which application claims the benefit under 35 U.S.C. Section 119(e) of:

U.S. Provisional Patent Application Ser. No. 60/869,447, filed on Dec. 11, 2006, by Shuji Nakamura, Steven P. DenBaars, and Hirokuni Asamizu, entitled, "TRANSPARENT LEDS";

all of which applications are incorporated by reference herein.

This application is related to the following co-pending and commonly-assigned applications:

U.S. Utility application Ser. No. 10/581,940, filed on Jun. 7, 2006, by Tetsuo Fujii, Yan Gao, Evelyn. L. Hu, and Shuji Nakamura, entitled "HIGHLY EFFICIENT GALLIUM NITRIDE BASED LIGHT EMITTING DIODES VIA SURFACE ROUGHENING," now U.S. Pat. No. 7,704,763, issued Apr. 27, 2010, which application claims the benefit under 35 U.S.C Section 365(c) of PCT Application Serial No. US2003/03921, filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING";

U.S. Utility application Ser. No. 11/054,271, filed on Feb. 9, 2005, by Rajat Sharma, P. Morgan Pattison, John F. Kaeding, and Shuji Nakamura, entitled "SEMICONDUCTOR LIGHT EMITTING DEVICE," now U.S. Pat. No. 8,227,820, issued Jul. 24, 2012;

U.S. Utility application Ser. No. 11/175,761, filed on Jul. 6, 2005, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS," now U.S. Pat. No. 7,344,958, issued Mar. 18, 2008, which application claims the benefit under 35 U.S.C Section 119(e) of U.S. Provisional Application Ser. No. 60/585,673, filed Jul. 6, 2004, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS";

U.S. Utility application Ser. No. 11/697,457, filed Apr. 6, 2007, by, Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY," now U.S. Pat. No. 7,956,360, issued Jun. 7, 2011, which application is a continuation of U.S. Utility application Ser. No. 11/140,893, filed May 31, 2005, by, Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY," now U.S. Pat. No. 7,208,393, issued Apr. 24, 2007, which application claims the benefit under 35 U.S.C. Section 119(e) of U.S. Provisional Application Ser. No. 60/576,685, filed Jun. 3, 2004, by Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY";

U.S. Utility application Ser. No. 11/067,957, filed Feb. 28, 2005, by Claude C. A. Weisbuch, Aurelien J. F. David, James S. Speck and Steven P. DenBaars, entitled "HORIZONTAL EMITTING, VERTICAL EMITTING, BEAM SHAPED, DISTRIBUTED FEEDBACK (DFB) LASERS BY GROWTH OVER A PATTERNED SUBSTRATE," now U.S. Pat. No. 7,723,745, issued May 25, 2010;

U.S. Utility application Ser. No. 11/923,414, filed Oct. 24, 2007, by Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE," now U.S. Pat. No. 7,755,096, issued Jul. 13, 2010, which application is a continuation of U.S. Pat. No. 7,291,864, issued Nov. 6, 2007, to Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE," now U.S. Pat. No. 7,291,864, issued Nov. 6, 2007;

U.S. Utility application Ser. No. 11/067,956, filed Feb. 28, 2005, by Aurelien J. F. David, Claude C. A Weisbuch and Steven P. DenBaars, entitled "HIGH EFFICIENCY LIGHT EMITTING DIODE (LED) WITH OPTIMIZED PHOTONIC CRYSTAL EXTRACTOR," now U.S. Pat. No. 7,582,910, issued Sep. 1, 2009;

U.S. Utility application Ser. No. 11/621,482, filed Jan. 9, 2007, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE," now U.S. Pat. No. 7,704,331, issued Apr. 27, 2010, which application is a continuation of U.S. Utility application Ser. No. 11/372,914, filed Mar. 10, 2006, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE," now U.S. Pat. No. 7,220,324, issued May 22, 2007, which application claims the benefit under 35 U.S.C. Section 119(e) of U.S. Provisional Application Ser. No. 60/660,283, filed Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE";

U.S. Utility application Ser. No. 11/403,624, filed Apr. 13, 2006, by James S. Speck, Troy J. Baker and Benjamin A. Haskell, entitled "WAFER SEPARATION TECHNIQUE FOR THE FABRICATION OF FREE-STANDING (AL, IN, GA)N WAFERS," which application claims the benefit under 35 U.S.C Section 119(e) of U.S. Provisional Application Ser. No. 60/670,810, filed Apr. 13, 2005, by James S. Speck, Troy J. Baker and Benjamin A. Haskell, entitled "WAFER SEPARATION TECHNIQUE FOR THE FABRICATION OF FREE-STANDING (AL, IN, GA)N WAFERS";

U.S. Utility application Ser. No. 11/403,288, filed Apr. 13, 2006, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS," now U.S. Pat. No. 7,795,146, issued Sep. 14, 2010, which application claims the benefit under 35 U.S.C Section 119(e) of U.S. Provisional Application Ser. No. 60/670,790, filed Apr. 13, 2005, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS";

U.S. Utility application Ser. No. 11/454,691, filed on Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD," now U.S. Pat. No. 7,719,020, issued May 18, 2010, which application claims the benefit under 35 U.S.C Section 119(e) of U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al, Ga, In)N AND ZnO DIRECT WAFER BONDING STRUCTURE FOR OPTOELECTRONIC APPLICATIONS, AND ITS FABRICATION METHOD," U.S. Provisional Application Ser. No. 60/732,319, filed on Nov. 1, 2005, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS, AND ITS FABRICATION METHOD," and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS AND ITS FABRICATION METHOD";

U.S. Utility application Ser. No. 11/444,084, filed May 31, 2006, by Bilge M, Imer, James S. Speck, and Steven P. DenBaars, entitled "DEFECT REDUCTION OF NON-POLAR GALLIUM NITRIDE WITH SINGLE-STEP SIDEWALL LATERAL EPITAXIAL OVERGROWTH," now U.S. Pat. No. 7,361,576, issued Apr. 22, 2008, which claims the benefit under 35 U.S.C. 119(e) of U.S. Provisional Application Ser. No. 60/685,952, filed on May 31, 2005, by Bilge M, Imer, James S. Speck, and Steven P. DenBaars, entitled "DEFECT REDUCTION OF NON-POLAR GALLIUM NITRIDE WITH SINGLE-STEP SIDEWALL LATERAL EPITAXIAL OVERGROWTH";

U.S. Utility application Ser. No. 11/870,115, filed Oct. 10, 2007, by Bilge M, Imer, James S. Speck, Steven P. DenBaars and Shuji Nakamura, entitled "GROWTH OF PLANAR NON-POLAR M-PLANE III-NITRIDE USING METALORGANIC CHEMICAL VAPOR DEPOSITION (MOCVD)," now U.S. Pat. No. 8,097,481, issued Jan. 17, 2012, which application is a continuation of U.S. Utility application Ser. No. 11/444,946, filed May 31, 2006, by Bilge M, Imer, James S. Speck, and Steven P. DenBaars, entitled "GROWTH OF PLANAR NON-POLAR {1-100} M-PLANE GALLIUM NITRIDE WITH METALORGANIC CHEMICAL VAPOR DEPOSITION (MOCVD)," now U.S. Pat. No. 7,338,828, issued Mar. 4, 2008, which claims the benefit under 35 U.S.C. 119(e) of U.S. Provisional Application Ser. No. 60/685,908, filed on May 31, 2005, by Bilge M, Imer, James S. Speck, and Steven P. DenBaars, entitled "GROWTH OF PLANAR NON-POLAR {1-100} M-PLANE GALLIUM NITRIDE WITH METALORGANIC CHEMICAL VAPOR DEPOSITION (MOCVD)";

U.S. Utility application Ser. No. 11/444,946, filed Jun. 1, 2006, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga, Al, In, B)N THIN FILMS, HETEROSTRUCTURES, AND DEVICES," now U.S. Pat. No. 7,846,757, issued Dec. 7, 2010, which claims the benefit under 35 U.S.C. 119(e) of U.S. Provisional Application Ser. No. 60/686,244, filed on Jun. 1, 2005, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga, Al, In, B)N THIN FILMS, HETERO STRUCTURES, AND DEVICES";

U.S. Utility application Ser. No. 11/251,365 filed Oct. 14, 2005, by Frederic S. Diana, Aurelien J. F. David, Pierre M. Petroff, and Claude C. A. Weisbuch, entitled "PHOTONIC STRUCTURES FOR EFFICIENT LIGHT EXTRACTION AND CONVERSION IN MULTI-COLOR LIGHT EMITTING DEVICES," now U.S. Pat. No. 7,768,023, issued Aug. 3, 2010;

U.S. Utility application Ser. No. 11/633,148, filed Dec. 4, 2006, Claude C. A. Weisbuch and Shuji Nakamura, entitled "IMPROVED HORIZONTAL EMITTING, VERTICAL EMITTING, BEAM SHAPED, DISTRIBUTED FEEDBACK (DFB) LASERS FABRICATED BY GROWTH OVER A PATTERNED SUBSTRATE WITH MULTIPLE OVERGROWTH," now U.S. Pat. No. 7,768,024, issued Aug. 3, 2010, which application claims the benefit under 35

U.S.C Section 119(e) of U.S. Provisional Application Ser. No. 60/741,935, filed Dec. 2, 2005, Claude C. A. Weisbuch and Shuji Nakamura, entitled "IMPROVED HORIZONTAL EMITTING, VERTICAL EMITTING, BEAM SHAPED, DFB LASERS FABRICATED BY GROWTH OVER PATTERNED SUBSTRATE WITH MULTIPLE OVERGROWTH";

U.S. Utility application Ser. No. 11/517,797, filed Sep. 8, 2006, by Michael Iza, Troy J. Baker, Benjamin A. Haskell, Steven P. DenBaars, and Shuji Nakamura, entitled "METHOD FOR ENHANCING GROWTH OF SEMIPOLAR (Al, In, Ga, B)N VIA METALORGANIC CHEMICAL VAPOR DEPOSITION," now U.S. Pat. No. 7,575,947, issued Aug. 18, 2009, which claims the benefit under 35 U.S.C. 119(e) of U.S. Provisional Application Ser. No. 60/715,491, filed on Sep. 9, 2005, by Michael Iza, Troy J. Baker, Benjamin A. Haskell, Steven P. DenBaars, and Shuji Nakamura, entitled "METHOD FOR ENHANCING GROWTH OF SEMIPOLAR (Al, In, Ga, B)N VIA METALORGANIC CHEMICAL VAPOR DEPOSITION";

U.S. Utility application Ser. No. 11/593,268, filed on Nov. 6, 2006, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED)," now U.S. Pat. No. 7,994,527, issued Aug. 9, 2011, which application claims the benefit under 35 U.S.C Section 119(e) of U.S. Provisional Application Ser. No. 60/734,040, filed on Nov. 4, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED)";

U.S. Utility application Ser. No. 11/608,439, filed on Dec. 8, 2006, by Steven P. DenBaars, Shuji Nakamura and James S. Speck, entitled "HIGH EFFICIENCY LIGHT EMITTING DIODE (LED)," now U.S. Pat. No. 7,956,371, issued Jun. 7, 2011, which application claims the benefit under 35 U.S.C Section 119(e) of U.S. Provisional Application Ser. No. 60/748,480, filed on Dec. 8, 2005, by Steven P. DenBaars, Shuji Nakamura and James S. Speck, entitled "HIGH EFFICIENCY LIGHT EMITTING DIODE (LED)," and U.S. Provisional Application Ser. No. 60/764,975, filed on Feb. 3, 2006, by Steven P. DenBaars, Shuji Nakamura and James S. Speck, entitled "HIGH EFFICIENCY LIGHT EMITTING DIODE (LED)";

U.S. Utility application Ser. No. 11/676,999, filed on Feb. 20, 2007, by Hong Zhong, John F. Kaeding, Rajat Sharma, James S. Speck, Steven P. DenBaars and Shuji Nakamura, entitled "METHOD FOR GROWTH OF SEMIPOLAR (Al, In,Ga,B)N OPTOELECTRONIC DEVICES," now U.S. Pat. No. 7,858,996, issued Dec. 28, 2010, which application claims the benefit under 35 U.S.C Section 119(e) of U.S. Provisional Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMIPOLAR (Al, In,Ga,B)N OPTOELECTRONIC DEVICES";

U.S. Utility patent application Ser. No. 11/840,057, filed on Aug. 16, 2007, by Michael Iza, Hitoshi Sato, Steven P. DenBaars, and Shuji Nakamura, entitled "METHOD FOR DEPOSITION OF MAGNESIUM DOPED (Al, In, Ga, B)N LAYERS," now U.S. Pat. No. 7,755,172, issued Jul. 13, 2010, which claims the benefit under 35 U.S.C. 119(e) of U.S. Provisional Patent Application Ser. No. 60/822,600, filed on Aug. 16, 2006, by Michael Iza, Hitoshi Sato, Steven P. DenBaars, and Shuji Nakamura, entitled "METHOD FOR DEPOSITION OF MAGNESIUM DOPED (Al, In, Ga, B)N LAYERS";

U.S. Utility patent application Ser. No. 11/940,848, filed on Nov. 15, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS," which application claims the benefit under 35 U.S.C Section 119(e) of U.S. Provisional Patent Application Ser. No. 60/866,014, filed on Nov. 15, 2006, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS," and U.S. Provisional Patent Application Ser. No. 60/883,977, filed on Jan. 8, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS";

U.S. Utility patent application Ser. No. 11/940,853, filed on Nov. 15, 2007, by Claude C. A. Weisbuch, James S. Speck and Steven P. DenBaars entitled "HIGH EFFICIENCY WHITE, SINGLE OR MULTI-COLOUR LIGHT EMITTING DIODES (LEDS) BY INDEX MATCHING STRUCTURES," which application claims the benefit under 35 U.S.C Section 119(e) of U.S. Provisional Patent Application Ser. No. 60/866,026, filed on Nov. 15, 2006, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES";

U.S. Utility patent application Ser. No. 11/940,866, filed on Nov. 15, 2007, by Aurelien J. F. David, Claude C. A. Weisbuch, Steven P. DenBaars and Stacia Keller, entitled "HIGH LIGHT EXTRACTION EFFICIENCY LIGHT EMITTING DIODE (LED) WITH EMITTERS WITHIN STRUCTURED MATERIALS," now U.S. Pat. No. 7,977,694, issued Jul. 12, 2011, which application claims the benefit under 35 U.S.C Section 119(e) of U.S. Provisional Patent Application Ser. No. 60/866,015, filed on Nov. 15, 2006, by Aurelien J. F. David, Claude C. A. Weisbuch, Steven P. DenBaars and Stacia Keller, entitled "HIGH LIGHT EXTRACTION EFFICIENCY LED WITH EMITTERS WITHIN STRUCTURED MATERIALS";

U.S. Utility patent application Ser. No. 11/940,876, filed on Nov. 15, 2007, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING," which application claims the benefit under 35 U.S.C Section 119(e) of U.S. Provisional Patent Application Ser. No. 60/866,027, filed on Nov. 15, 2006, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING";

U.S. Utility patent application Ser. No. 11/940,885, filed on Nov. 15, 2007, by Natalie N. Fellows, Steven P. DenBaars and Shuji Nakamura, entitled "TEXTURED PHOSPHOR CONVERSION LAYER LIGHT EMITTING DIODE," now U.S. Pat. No. 8,860,051, issued Oct. 14, 2014, which application claims the benefit under 35 U.S.C Section 119(e) of U.S. Provisional Patent Application Ser. No. 60/866,024, filed on Nov. 15, 2006, by Natalie N. Fellows, Steven P. DenBaars and Shuji Nakamura, entitled

"TEXTURED PHOSPHOR CONVERSION LAYER LIGHT EMITTING DIODE";

U.S. Utility patent application Ser. No. 11/940,872, filed on Nov. 15, 2007, by Steven P. DenBaars, Shuji Nakamura and Hisashi Masui, entitled "HIGH LIGHT EXTRACTION EFFICIENCY SPHERE LED," which application claims the benefit under 35 U.S.C Section 119(e) of U.S. Provisional Patent Application Ser. No. 60/866,025, filed on Nov. 15, 2006, by Steven P. DenBaars, Shuji Nakamura and Hisashi Masui, entitled "HIGH LIGHT EXTRACTION EFFICIENCY SPHERE LED";

U.S. Utility patent application Ser. No. 11/940,883, filed on Nov. 15, 2007, by Shuji Nakamura and Steven P. DenBaars, entitled "STANDING TRANSPARENT MIRRORLESS LIGHT EMITTING DIODE," now U.S. Pat. No. 7,687,813, issued Mar. 30, 2010, which application claims the benefit under 35 U.S.C Section 119(e) of U.S. Provisional Patent Application Ser. No. 60/866,017, filed on Nov. 15, 2006, by Shuji Nakamura and Steven P. DenBaars, entitled "STANDING TRANSPARENT MIRROR-LESS (STML) LIGHT EMITTING DIODE";

U.S. Utility patent application Ser. No. 11/940,898, filed on Nov. 15, 2007, by Steven P. DenBaars, Shuji Nakamura and James S. Speck, entitled "TRANSPARENT MIRRORLESS LIGHT EMITTING DIODE," now U.S. Pat. No. 7,781,789, issued Aug. 24, 2010, which application claims the benefit under 35 U.S.C Section 119(e) of U.S. Provisional Patent Application Ser. No. 60/866,023, filed on Nov. 15, 2006, by Steven P. DenBaars, Shuji Nakamura and James S. Speck, entitled "TRANSPARENT MIRRORLESS (TML) LIGHT EMITTING DIODE";

U.S. Utility patent application Ser. No. 11/954,163, filed on Dec. 11, 2007, by Steven P. DenBaars and Shuji Nakamura, entitled "LEAD FRAME FOR TRANSPARENT MIRRORLESS LIGHT EMITTING DIODE," which claims the benefit under 35 U.S.C. 119(e) of U.S. Provisional Patent Application Ser. No. 60/869,454, filed on Dec. 11, 2006, by Steven P. DenBaars and Shuji Nakamura, entitled "LEAD FRAME FOR TM-LED";

U.S. Utility patent application Ser. No. 12/001,286, filed on Dec. 11, 2007, by Mathew C. Schmidt, Kwang Choong Kim, Hitoshi Sato, Steven P. DenBaars, James S. Speck, and Shuji Nakamura, entitled "METALORGANIC CHEMICAL VAPOR DEPOSITION (MOCVD) GROWTH OF HIGH PERFORMANCE NON-POLAR III-NITRIDE OPTICAL DEVICES," now U.S. Pat. No. 7,842,527, issued Nov. 30, 2010, which claims the benefit under 35 U.S.C. 119(e) of U.S. Provisional Patent Application Ser. No. 60/869,535, filed on Dec. 11, 2006, by Mathew C. Schmidt, Kwang Choong Kim, Hitoshi Sato, Steven P. DenBaars, James S. Speck, and Shuji Nakamura, entitled "MOCVD GROWTH OF HIGH PERFORMANCE M-PLANE GAN OPTICAL DEVICES";

U.S. Utility patent application Ser. No. 12/001,227, filed on Dec. 11, 2007, by Steven P. DenBaars, Mathew C. Schmidt, Kwang Choong Kim, James S. Speck, and Shuji Nakamura, entitled, "NON-POLAR AND SEMI-POLAR EMITTING DEVICES," now U.S. Pat. No. 9,130,119, issued Sep. 8, 2015, which claims the benefit under 35 U.S.C. 119(e) of U.S. Provisional Patent Application Ser. No. 60/869,540, filed on Dec. 11, 2006, by Steven P. DenBaars, Mathew C. Schmidt, Kwang Choong Kim, James S. Speck, and Shuji Nakamura, entitled, "NON-POLAR (M-PLANE) AND SEMI-POLAR EMITTING DEVICES"; and U.S. Utility patent application Ser. No. 11/954,172, filed on Dec. 11, 2007, by Kwang Choong Kim, Mathew C. Schmidt, Feng Wu, Asako Hirai, Melvin B. McLaurin, Steven P. DenBaars, Shuji Nakamura, and James S. Speck, entitled, "CRYSTAL GROWTH OF M-PLANE AND SEMIPOLAR PLANES OF (AL, IN, GA, B)N ON VARIOUS SUBSTRATES," which claims the benefit under 35 U.S.C. 119(e) of U.S. Provisional Patent Application Ser. No. 60/869,701, filed on Dec. 12, 2006, by Kwang Choong Kim, Mathew C. Schmidt, Feng Wu, Asako Hirai, Melvin B. McLaurin, Steven P. DenBaars, Shuji Nakamura, and James S. Speck, entitled, "CRYSTAL GROWTH OF M-PLANE AND SEMIPOLAR PLANES OF (AL, IN, GA, B)N ON VARIOUS SUBSTRATES";

all of which applications are incorporated by reference herein.

BACKGROUND OF THE INVENTION

1. Field of the Invention

The present invention is related to light extraction from light emitting diodes (LEDs).

2. Description of the Related Art (Note: This application references a number of different publications as indicated throughout the specification. In addition, a list of a number of different publications can be found below in the section entitled "References." Each of these publications is incorporated by reference herein.)

In order to increase the light output power from the front side of a light emitting diode (LED), the emitted light is reflected by a mirror placed on the backside of the substrate or is reflected by a mirror coating on the lead frame, even if there are no mirrors on the backside of the substrate, if the bonding material is transparent on the emission wavelength. However, this reflected light is re-absorbed by the emitting layer (active layer), because the photon energy is almost same as the band-gap energy of the light emitting species, such as AlInGaN multiple quantum wells (MQWs). The efficiency or output power of the LEDs is decreased due to this re-absorption of the light by the emitting layer. See, for example, FIGS. 1, 2 and 3, which are described in more detail below. See also Jpn. J. Appl. Phys., 34, L797-99 (1995) and Jpn. J. Appl. Phys., 43, L180-82 (2004).

What is needed in the art are LED structures that more effectively extract light. The present invention satisfies that need.

SUMMARY OF THE INVENTION

The present invention describes a transparent light emitting diode. Generally, the present invention describes a light emitting device comprised of a plurality of III-nitride layers, including an active region that emits light, wherein all of the layers except for the active region are transparent for an emission wavelength of the light, such that the light is extracted effectively through all of the layers and in multiple directions through the layers. Moreover, the surface of one or more of the III-nitride layers may be roughened, textured, patterned or shaped to enhance light extraction.

In one embodiment, the III-nitride layers reside on a transparent substrate or sub-mount, wherein the III-nitride layers are wafer bonded with the transparent substrate or sub-mount using a transparent glue, a transparent epoxy, or other transparent material, and light is extracted through the transparent substrate or sub-mount. The transparent substrate or sub-mount are electrically conductive, as is the transparent glue, transparent epoxy, or other transparent material.

A lead frame supports the III-nitride layers (as well as the transparent substrate or sub-mount), which reside on a transparent plate in the lead frame. Thus, the light emitted from the III-nitride layers is transmitted through the transparent plate in the lead frame.

Moreover, the device may include one or more transparent conducting layers that are positioned to electrically connect the III-nitride layers, and one or more current spreading layers that are deposited on the III-nitride layers, wherein the transparent conducting layers are deposited on the current spreading layers. Mirrors or mirrored surfaces are eliminated from the device to minimize internal reflections in order to minimize re-absorption of the light by the active region.

In another embodiment, the III-nitride layers are embedded in or combined with a shaped optical element, and the light is extracted from more than one surface of the III-nitride layers before entering the shaped optical element and subsequently being extracted. Specifically, at least a portion of the light entering the shaped optical element lies within a critical angle and is extracted. Moreover, one or more surfaces of the shaped optical element may be roughened, textured, patterned or shaped to enhance light extraction. Further, the shaped optical element may include a phosphor layer, which may be roughened, textured, patterned or shaped to enhance light extraction. The shaped optical element may be an inverted cone shape, wherein the III-nitride layers are positioned within the inverted cone shape such that the light is reflected by sidewalls of the inverted cone shape.

In yet another embodiment, an insulating layer covering the III-nitride layers is partially removed, and a conductive layer is deposited within a hole or depression in the surface of the insulating layer to make electrical contact with the III-nitride layers.

BRIEF DESCRIPTION OF THE DRAWINGS

Referring now to the drawings in which like reference numbers represent corresponding parts throughout:

FIGS. 8A and 8B are schematic and plan view illustrations, respectively, of an improved LED structure according to the preferred embodiment of the present invention.

FIG. 9 is a schematic illustration of an improved LED structure according to the preferred embodiment of the present invention.

FIGS. 10A and 10B are schematic and plan view illustrations, respectively, of an improved LED structure according to the preferred embodiment of the present invention.

FIG. 11 is a schematic illustration of an improved LED structure according to the preferred embodiment of the present invention.

FIGS. 18A and 18B are schematic and plan view illustrations, respectively, of an improved LED structure according to the preferred embodiment of the present invention.

FIGS. 19A and 19B are schematic and plan view illustrations, respectively, of an improved LED structure according to the preferred embodiment of the present invention.

FIGS. 20A and 20B are schematic and plan view illustrations, respectively, of an improved LED structure according to the preferred embodiment of the present invention.

FIGS. 21A and 21B are schematic and plan view illustrations, respectively, of an improved LED structure according to the preferred embodiment of the present invention.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

In the following description of the figures, the details of the LED structures are not shown. Only the emitting layer (usually AlInGaN MQW), p-type GaN layer, n-type GaN layer and sapphire substrate are shown. Of course, there may be other layers in the LED structure, such as a p-AlGaN electron blocking layer, InGaN/GaN super lattices and others. In this invention, the most important aspects are the surfaces of the LED structure, because the light extraction efficiency is determined mainly by the surface layer or condition of the epitaxial wafers. Consequently, only some aspects (the surface layers) of the LED are shown in all of the figures.

Conventional LED Structures

Figure 1:
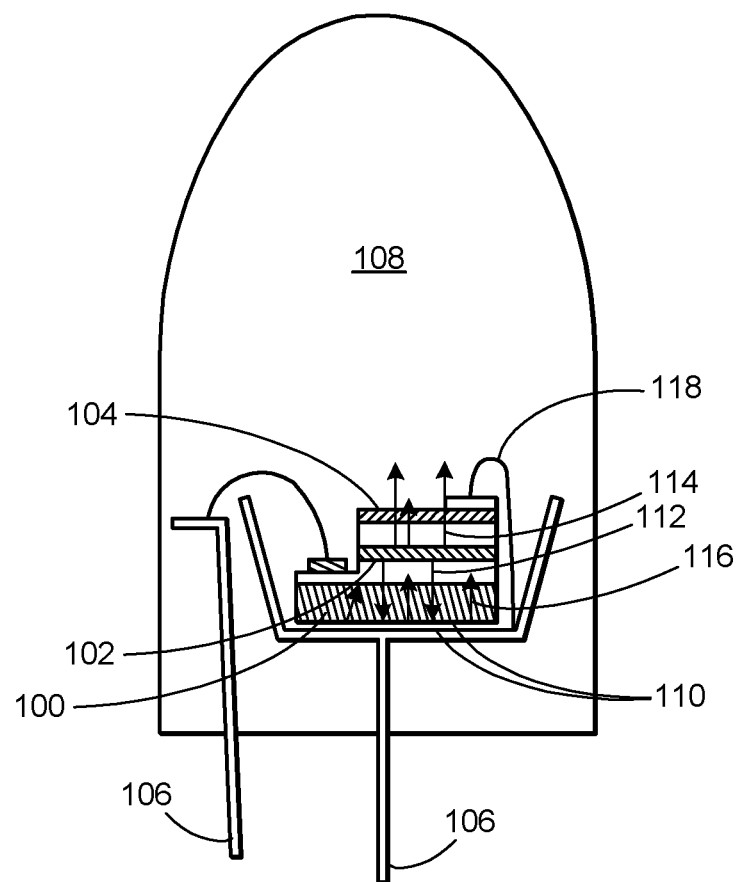
FIGS. 1, 2 and 3 are cross-sectional schematic illustrations of conventional LEDs.
Figure 2:
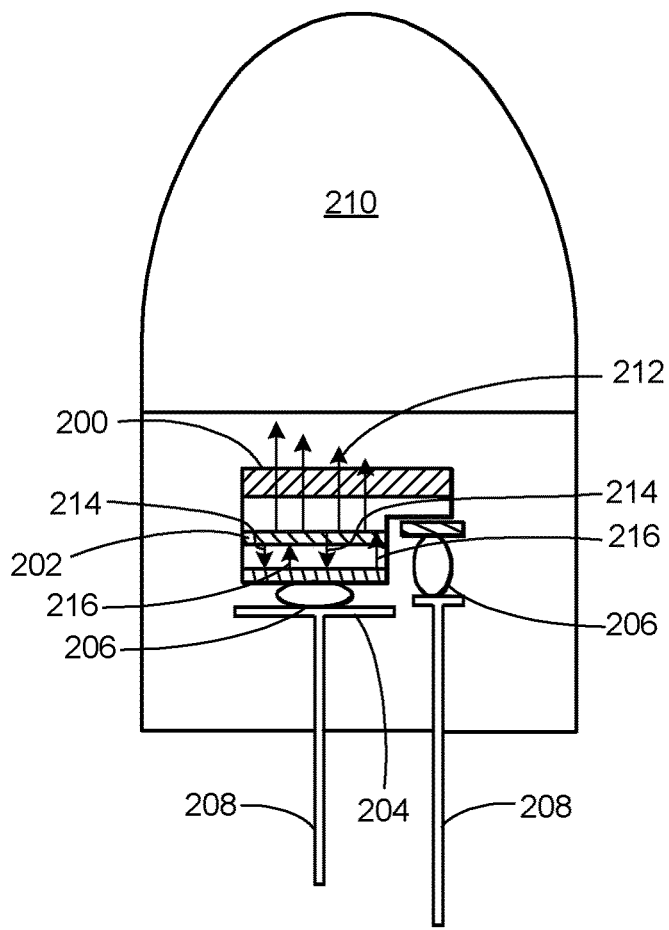
Figure 3:
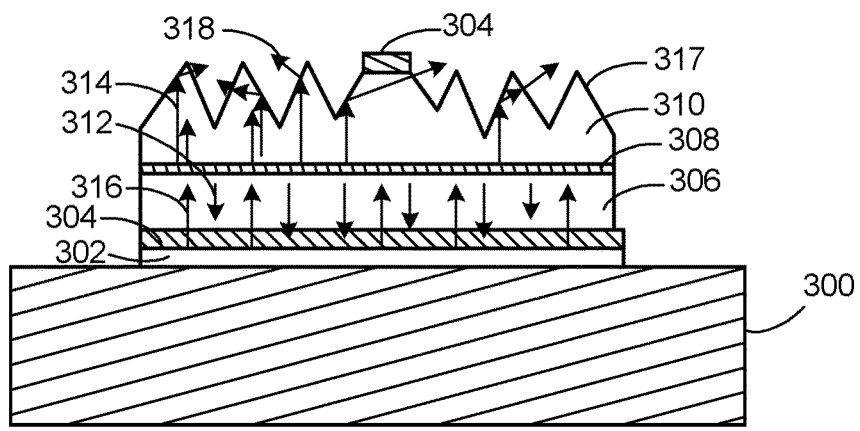

FIGS. 1, 2 and 3 are schematic illustrations of conventional LEDs.

In conventional LEDs, in order to increase the light output power from the front side of the LED, the emitting light is reflected by the mirror on the backside of the sapphire substrate or the mirror coating on the lead frame even if there is no mirrors on the backside of the sapphire substrate and if the bonding material is transparent on the emission wavelength. This reflected light is re-absorbed by the emitting layer (active layer) because the photon energy is almost same as the band-gap energy of the quantum well of AlInGaN multi-quantum well (MQW). Then, the efficiency or output power of the LEDs is decreased due to the re-absorption by the emitting layer.

In FIG. 1, a conventional LED includes a sapphire substrate 100, emitting layer 102 (active layer), and semi-transparent or transparent electrodes 104, such as ITO or ZnO. The LED is die-bonded on a lead frame 106 with a clear epoxy molding 108 without any mirror on the back side of the sapphire substrate 100. In this case, the coating material on the lead frame 106, or the surface of the lead frame 106, becomes a mirror 110. If there is a mirror 110 on the back side of the substrate 100, the LED chip is die-bonded using an Ag paste. The active layer 102 emits light 112 towards the substrate 100 and emits light 114 towards the electrodes 104. The emitting light 112 is reflected by the mirror 110 towards the electrode 104, becoming reflected light 116 which is transmitted by the electrode 104 to escape the LED. The LED is wire bonded 118 to the lead frame 106.

In FIG. 2, the conventional LED is similar to that shown in FIG. 1, except that it is a flip-chip LED. The LED includes a sapphire substrate 200 and emitting layer 202 (active layer), and a highly reflective mirror 204. The LED is die-bonded 206 onto a lead frame 208 and embedded in a clear epoxy molding 210. The active layer 202 emits light 212 towards the substrate 200 and emits light 214 towards the highly reflective mirror 204. The emitting light 214 is reflected by the mirror 204 towards the substrate 200, becoming reflected light 216 which is transmitted by the substrate 200 to escape the LED.

In FIG. 3, the conventional LED includes a conducting sub-mount 300, high reflectivity mirror 302 (with Ag>94% reflectivity (R)), a transparent ITO layer 304, a p-GaN layer 306, an emitting or active layer 308, and an n-GaN layer 310. The LED is shown without the epoxy molding, although similar molding may be used. The emitting layer 308 emits LED emissions 312 towards the mirror 302 and emits LED emissions 314 towards the n-GaN layer 310. The emission 312 of the emitting layer 308 is reflected by the mirror 302, where the reflective light emissions 316 are re-absorbed by the emitting layer 308. The efficiency of the LED is decreased due to this re-absorption. The n-GaN layer may be roughened 317 to enhance extraction 318 of LED emissions 314.

Improved LED Structures

The present invention describes a transparent LED. Generally, the present invention describes a light emitting device comprised of a plurality of III-nitride layers, including an active region that emits light, wherein all of the layers except for the active region are transparent for an emission wavelength of the light, such that the light is extracted effectively through all of the layers and in multiple directions through the layers. The surface of one or more of the III-nitride layers may be roughened, textured, patterned or shaped to enhance light extraction.

Figure 4A:
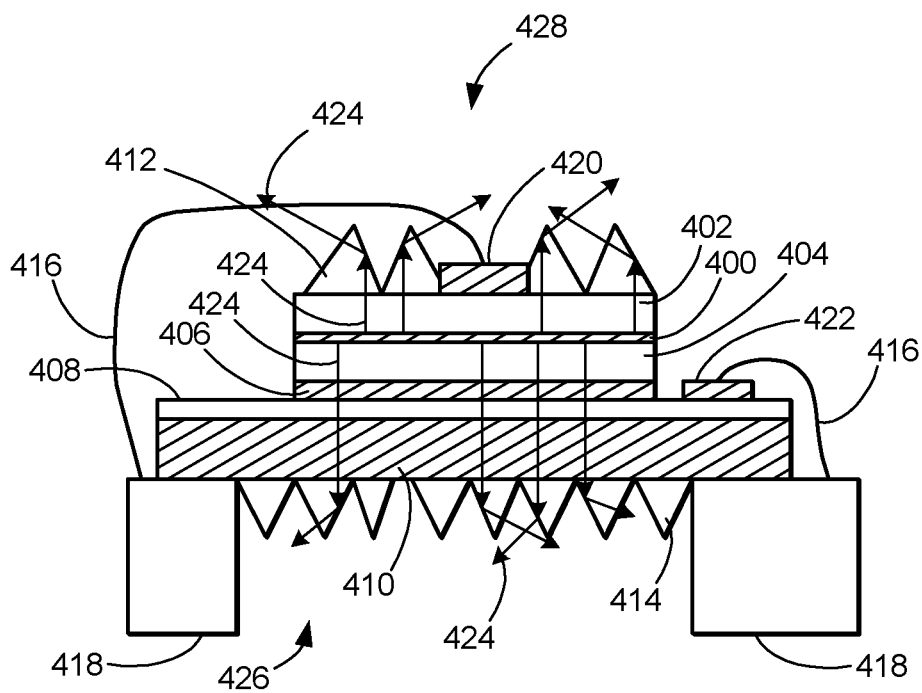
FIGS. 4A and 4B are schematic and plan view illustrations, respectively, of an improved LED structure according to the preferred embodiment of the present invention.
Figure 4B:
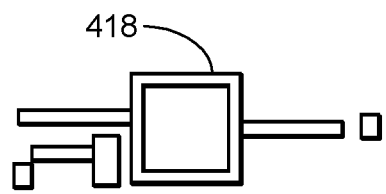

FIG. 4A is a schematic illustrating a specific improved LED structure according the preferred embodiment of the present invention, wherein the improved LED structure comprises an emitting layer 400, an n-type GaN layer 402, a p-type GaN layer 404, a first ITO layer 406, a second ITO layer 408, and a glass layer 410. The n-type GaN layer 402 may have surface 412 that is roughened, textured, patterned or shaped (e.g., a cone shaped surface), and the glass layer 410 may have a surface 414 that is roughened, textured, patterned or shaped (e.g., a cone shaped surface). The LED is wire bonded 416 to a lead frame 418 via bonding pads 420, 422. FIG. 4B shows a top view of the lead frame 418.

In FIG. 4A, the LED structure is grown on a sapphire substrate, which is removed using a laser de-bonding technique. Thereafter, the first ITO layer 406 is deposited on the p-type GaN layer 404. The LED structure is then attached to the glass layer 410, which is coated by the second ITO layer 408, using an epoxy as a glue. The LED structure is then wire bonded 416 to the lead frame 418.

In FIG. 4A, there are no intentional mirrors at the front or back sides of the LED. Instead, the lead frame 418 is designed to effectively extract light 424 from both sides of the LED, because the frame 418 does not obstruct the surfaces 412 and 414, i.e., the back side 426 of the LED as well as the front side 428 of the LED. FIG. 4B shows that the frame 418 supports the LED at the edges of the glass layer 410, leaving the emitting surface of the glass layer 410 and LED unobstructed.

An ohmic contact may be placed below the bonding pad 420 on the n-GaN layer 402, but is not shown in the figure for simplicity.

Figure 5A:
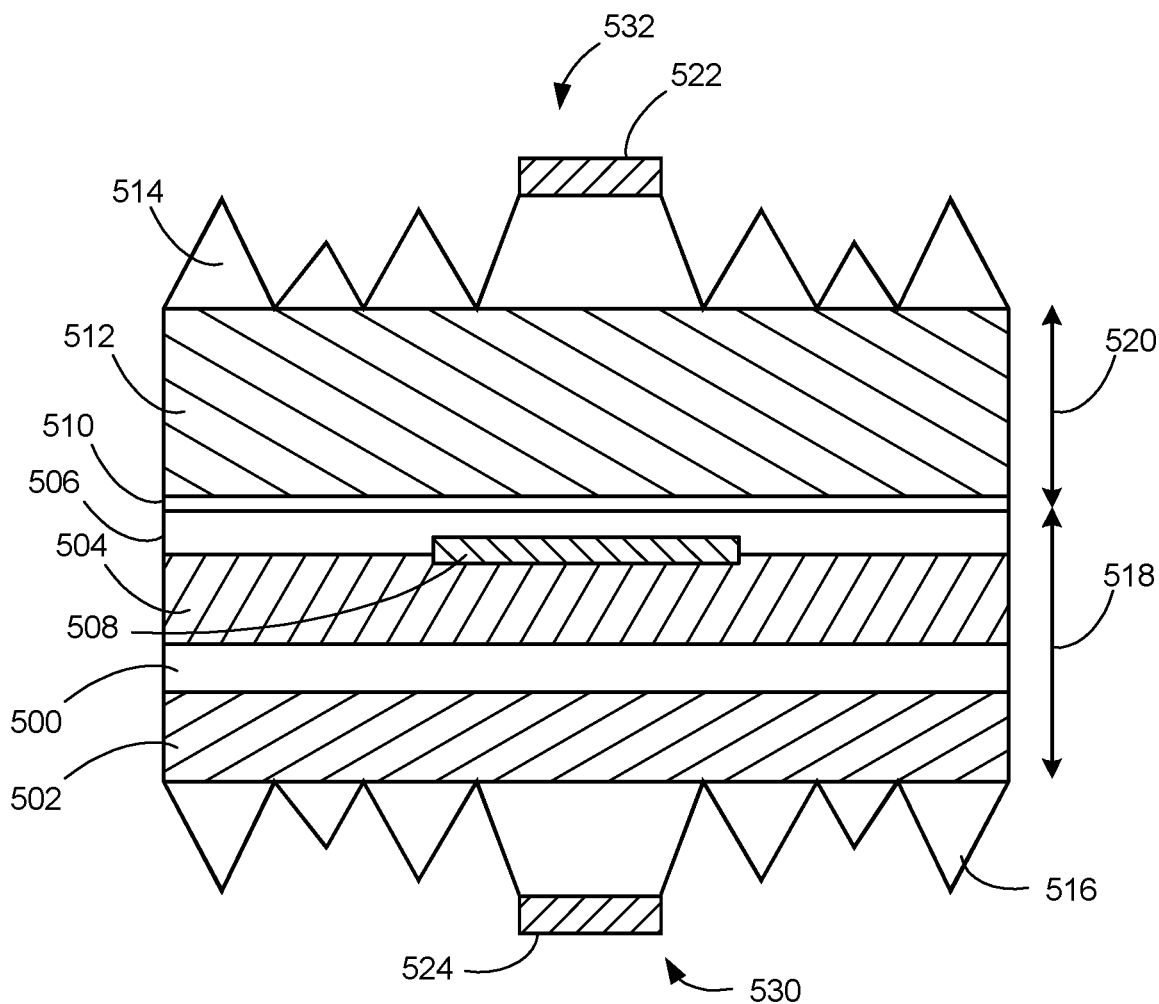
FIGS. 5A and 5B are schematic and plan view illustrations, respectively, of an improved LED structure according to the preferred embodiment of the present invention.

FIG. 5A is a schematic illustrating a specific improved LED structure according the preferred embodiment of the present invention, wherein the improved LED structure comprises an InGaN multiple quantum well (MQW) layer as an emitting layer 500, an n-type GaN layer 502, a p-type GaN layer 504, an ITO or ZnO layer 506, a transparent insulating layer 508, and transparent conductive glue 510 for bonding the ITO or ZnO layer 506 to a transparent conductive substrate 512. The transparent conductive substrate 512 may have a surface 514 that is roughened, textured, patterned or shaped (e.g., a cone shaped surface), and the n-GaN layer 504 may have a surface 516 that is roughened, textured, patterned or shaped (e.g., a cone shaped surface). Preferably, the layers 500, 502, 504 and 506 have a combined thickness 518 of approximately 5 microns, and the substrate 512 and glue 510 have a combined thickness 520 of approximately 400 microns. Finally, ohmic electrode/bonding pads 522, 524 are placed on the LED.

The LED structure may be grown on a sapphire substrate, which is removed using a laser de-bonding technique. The ITO layer 506 is then deposited on the p-type GaN layer 504. Before deposition of the ITO layer 506, the insulating layer 508, which may comprise $SiO_2$ or SiN, is deposited as a current spreading layer. Without the current spreading layer 508, the emission intensity of the LED becomes small due to non-uniform current flows. The transparent conductive substrate 512, which may be ZnO, $Ga_2O_3$, or another material that is transparent at the desired wavelengths, is wafer bonded or glued to the ITO layer 506 using the transparent conductive glue 510. Then, an n-GaN ohmic electrode/bonding pad 522 and an p-GaN ohmic electrode/bonding pad 524 are formed on both sides of the LED structure. Finally, the nitrogen-face (N-face) of the n-type GaN layer 502 is roughened, textured, patterned or shaped 516 to enhance light extraction, for example, using a wet etching, such as KOH or HCL, to form a cone-shaped surface 516.

Figure 5B:
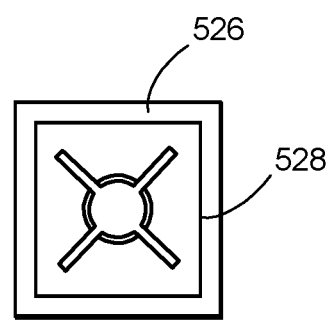

FIG. 5B is a plan view of the LED of FIG. 5A, and shows the LED placed on a transparent plate 526, which resides on a lead frame 528, both of which work to remove heat from the LED. The p-side of the LED (i.e., the side with the substrate 512) is attached to the transparent plate 526. Wire bonding is performed between the bonding pad 524 of the n-type GaN layer 502 and the lead frame 528.

There are no intentional mirrors at the front 530 or back sides 532 of the LED. Instead, the lead frame 528 is designed to effectively extract light from both sides of the LED, i.e., the back side 532 of the LED as well as the front side 530 of the LED.

Finally, an ohmic contact may be placed below the bonding pad 524 of the n-GaN layer 502. However, this ohmic contact is not shown in the figure for simplicity.

Figure 6:
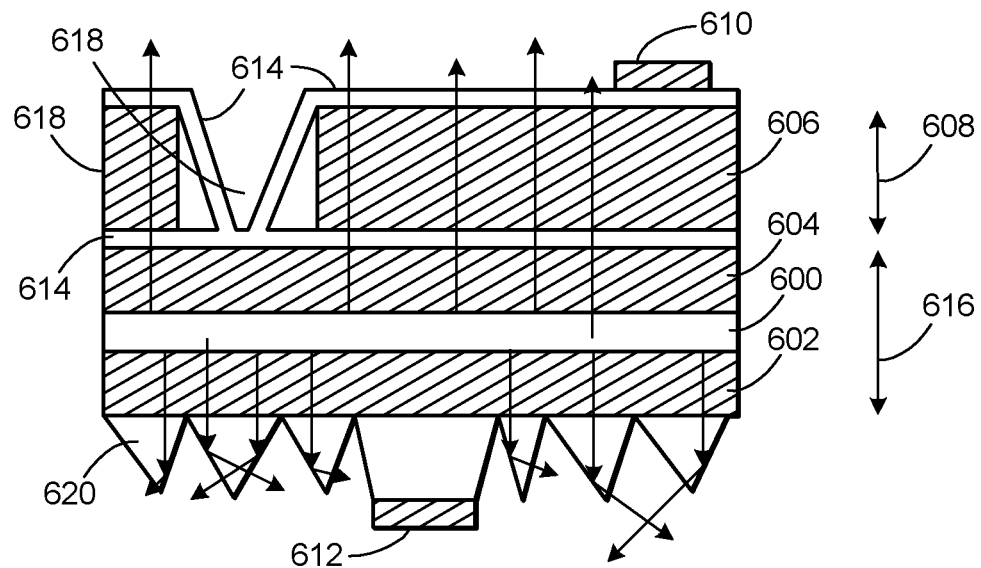
FIG. 6 is a schematic illustration of an improved LED structure according to the preferred embodiment of the present invention.

FIG. 6 is a schematic illustrating a specific improved LED structure according the preferred embodiment of the present invention, wherein the improved LED structure comprises an InGaN MQW active layer 600, an n-GaN layer 602, a p-GaN layer 604, an epoxy layer 606 (which is approximately 400 microns thick 608), a bonding pad 610, an ohmic electrode/bonding pad 612, and an ITO or ZnO layer 614. The combined thickness 616 of the n-GaN layer 602, active layer 600 and p-GaN layer 604 is approximately 5 microns.

Figure 7:
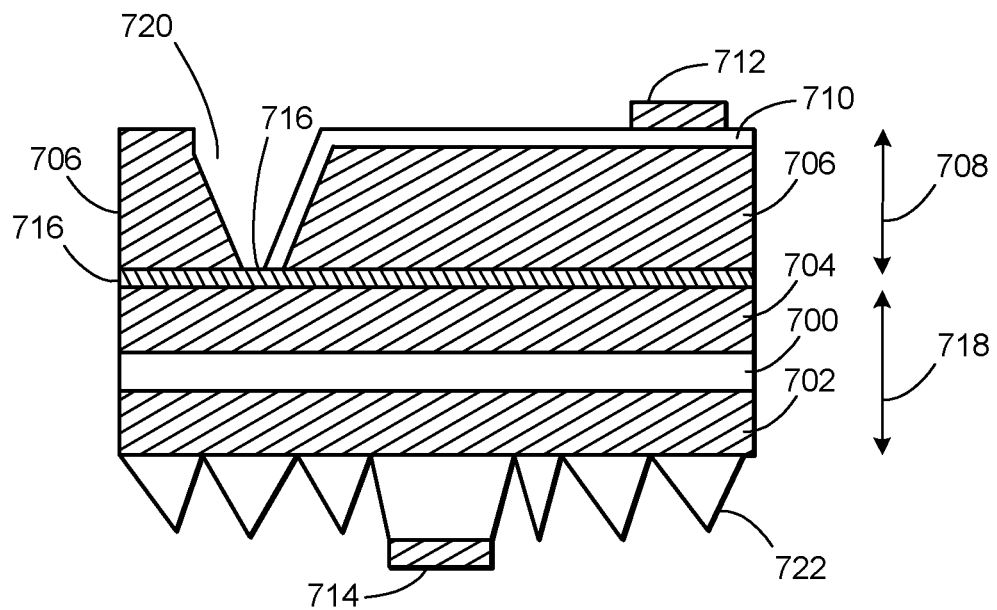
FIG. 7 is a schematic illustration of an improved LED structure according to the preferred embodiment of the present invention.

FIG. 7 is a schematic illustrating a specific improved LED structure according the preferred embodiment of the present invention, wherein the improved LED structure comprises an InGaN MQW active layer 700, an n-GaN layer 702, a p-GaN layer 704, an epoxy layer 706 (approximately 400 microns thick 708), a narrow stripe Au connection 710, a bonding pad 712, an ohmic electrode/bonding pad 714, and ITO or ZnO 716. The thickness 718 of the n-GaN 702, active layer 700 and p-GaN layer 704 is approximately 5 microns.

In both FIGS. 6 and 7, a thick epoxy layer 606, 706 is used, rather than the glass layer 410 shown in FIG. 4. To make electrical contact, the epoxy insulating layers 606, 706 are partially removed, and the ITO layer 614, which is a transparent metal oxide, or a narrow stripe of Au or other metal layer 710, are deposited on the epoxy layers 606, 706, as well as within a hole or depression 618, 720 in the surface of the epoxy layers 606, 706, to make electrical; contact with the p-GaN layer 604, 704.

In addition, both FIGS. 6 and 7 show that roughened, textured, patterned or shaped surfaces 620, 722 are formed on the nitrogen face (N-face) of the n-type GaN layers 602, 702. These roughened, textured, patterned or shaped surfaces 620, 722 enhance light extraction.

Note that, if a GaN substrate is used instead of a sapphire substrate, laser de-bonding would not be required and, a result, the sub-mounts 606, 706 would not be required. Moreover, if the LED structure is created on a GaN substrate, the ITO layer 614 would be deposited on the p-type GaN layer 604 and the backside of the GaN substrate, which is an N-face GaN, could be etched using a wet etching, such as KOH and HCL in order to form surfaces 620, 722 that are roughened, textured, patterned or shaped on the n-type GaN layers 602, 702.

Note also that, if the surface of the ITO layer 614 is roughened, textured, patterned or shaped, light extraction is increased through the ITO layer 614. Even without the ITO layer 614 on the p-type GaN layer 604, the roughening, texturing, patterning or shaping of the surface of the p-type GaN layer 604 is effective to increase the light extraction through the p-type GaN layer 604.

Finally, an ohmic contact for the n-type GaN layer 612, and the ITO or ZnO layer 614 may be used after the surface 620 roughening, texturing, patterning or shaping of the n-type GaN layer 602. The ITO or ZnO layer 614 has a similar refractive index as GaN and, as a result, the light reflection at the interface between the ITO, ZnO and GaN is minimized.

FIG. 8A is a schematic illustrating a specific improved LED structure according the preferred embodiment of the present invention, wherein the improved LED structure comprises an emitting layer 800, an n-type GaN layer 802, a p-type GaN layer 804, a first ITO layer 806, a second ITO layer 808, and a glass layer 810. The n-type GaN layer 802 has a surface 812 that is roughened, textured, patterned or shaped (e.g., a cone shape surface), and the glass layer 810 has a surface 814 that is roughened, textured, patterned or shaped (e.g., a cone shape surface). The LED is wire bonded 816 to a lead frame or sub-mount 818 using the bonding pads 820, 822.

The LED may be embedded with or contained in a molding or shaped optical element 824, such as a sphere made of epoxy or glass, forming, for example, a lens. The shaped optical element 824 may include a phosphor layer 826, which may be remote from the LED, that is roughened, textured, patterned or shaped, for example, on an outer surface of the shaped optical element 824. In this embodiment, the emitting layer 800 emits light 828 towards the surfaces 812 and 814, where the light can be extracted 830.

In this embodiment, because the shaped optical element 824 is a sphere, the LED structure can be considered a small spot light source, because the direction of all of the light emitted from the LED is substantially normal to the interface between air and the sphere 824, and the light therefrom is effectively extracted to air through the interface between air and the sphere 824.

In addition, if the phosphor layer 826 is placed on or near the outer surface of the shaped optical element, the conversion efficiency, for example, from blue light to white light, is increased due to reduced re-absorption of the light 828 resulting from reduced back scattering of the light 828 by the phosphor layer 826. Moreover, if the surface 834 of the phosphor layer 826 is roughened, textured, patterned or shaped, light extraction is again increased.

Finally, FIG. 8B is a top view of the device in FIG. 8A, illustrating the lead frame 818.

FIG. 9 is a schematic illustrating a specific improved LED structure according the preferred embodiment of the present invention, wherein the improved LED structure comprises an InGaN MQW emitting layer 900, an n-type GaN layer 902, a p-type GaN layer 904, an ITO layer 906 having a surface 908 that is roughened, textured, patterned or shaped, a bonding pad 910, an ohmic contact/bonding pad 912, a surface 914 of the n-type GaN layer 902 that is roughened, textured, patterned or shaped, and an epoxy layer 916 that is deposited on the 908. The LED may be embedded with or contained in a molding or shaped optical element 918, such as a sphere made of epoxy or glass, forming, for example, a lens. The shaped optical element 918 may include a phosphor layer 920, which may be remote from the LED, that is roughened, textured, patterned or shaped, for example, on an outer surface of the shaped optical element 918.

In FIG. 9, the ITO or ZnO layer 906 is roughened, textured, patterned or shaped to improve light extraction through the ITO or ZnO layer 906. In addition, the epoxy 918 is sub-mounted. Otherwise, the structure of FIG. 9 is the same as that shown in FIGS. 6-8.

FIG. 10A is a schematic illustrating a specific improved LED structure according the preferred embodiment of the present invention, wherein the improved LED structure comprises an InGaN MQW emitting layer 1000, an n-type GaN layer 1002, a p-type GaN layer 1004, an ITO layer 1006, a bonding pad 1008, an ohmic contact/bonding pad 1010, a surface 1012 of the ITO layer 1006 that is roughened, textured, patterned or shaped, a surface 1014 of the n-type GaN layer 1002 that is roughened, textured, patterned or shaped, and an epoxy layer 1016 that is deposited on the surface 1012.

The LED may be embedded with or contained in a molding or shaped optical element 1018, such as a sphere made of epoxy or glass, forming, for example, a lens. The shaped optical element 1018 may include a phosphor layer 1020, which may be remote from the LED, that is roughened, textured, patterned or shaped, for example, on an outer surface of the shaped optical element 1018.

The LED may also include a current spreading layer 1022, which may comprise SiN, $SiO_2$, or some other insulating material, for example, is deposited before the ITO or ZnO layer 1006 to flow the current uniformly through the p-type GaN layer 1004.

Finally, the LED is wire bonded 1024 to a lead frame 1026. FIG. 10B shows a top view of the lead frame 1026.

FIG. 11 is a schematic illustrating a specific improved LED structure according the preferred embodiment of the present invention, wherein the improved LED structure comprises an InGaN MQW emitting layer 1100, an n-type GaN layer 1102, a p-type GaN layer 1104, an ITO layer 1106, a bonding pad 1108, an ohmic contact/bonding pad 1110, a surface 1112 of the ITO layer 1106 that is roughened, textured, patterned or shaped, a surface 1114 of the p-type GaN layer 1102 that is roughened, textured, patterned or shaped, and an epoxy layer 1116 that is deposited on the surface 1112.

The LED may be embedded with or contained in a molding or shaped optical element 1118, such as a sphere made of epoxy or glass, forming, for example, a lens. The shaped optical element 1118 may include a phosphor layer 1120, which may be remote from the LED, that is roughened, textured, patterned or shaped, for example, on an outer surface of the shaped optical element 1118.

The LED may also include a current spreading layer 1122, which may comprise SiN, $SiO_2$, or some other insulating material, for example, that is deposited before the ITO or ZnO layer 1106 to flow the current uniformly through the p-type GaN layer 1104.

Finally, the LED is wire bonded 1124 to a lead frame 1126. FIG. 11B shows a top view of the lead frame 1126.

In the embodiment of FIG. 11, a mirror 1128 is placed outside of the shaped optical element 1118, in order to obtain more light from a front side 1130 of the device. The shape of the mirror is designed to prevent reflected light from reaching the LED, in order to reduce re-absorption of the light by the LED.

Figure 12A:
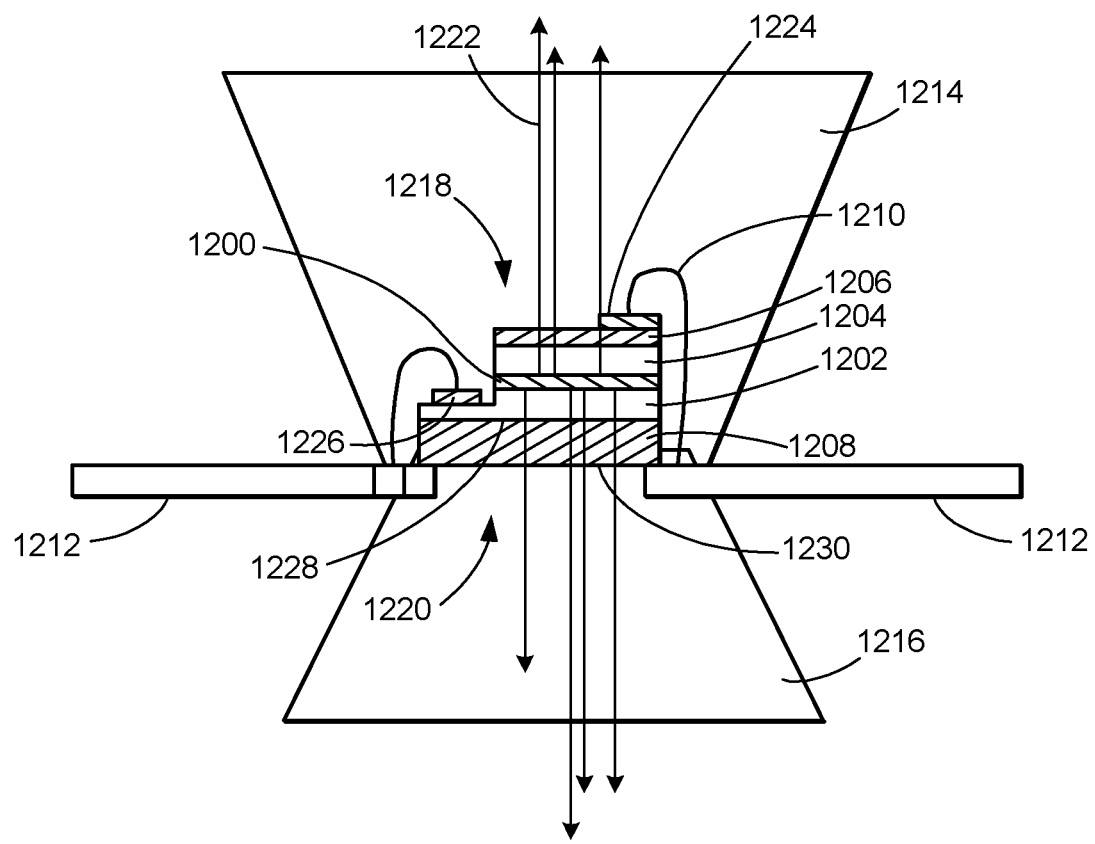
FIGS. 12A and 12B are schematic and plan view illustrations, respectively, of an improved LED structure according to the preferred embodiment of the present invention.

FIG. 12A is a schematic illustrating a specific improved LED structure according the preferred embodiment of the present invention, wherein the improved LED structure comprises an emitting layer 1200, an n-type GaN layer 1202, a p-type GaN layer 1204, an ITO or ZnO layer 1206, and a substrate 1208, which may be a flat sapphire substrate or a patterned sapphire substrate (PSS). The LED is wire bonded 1210 to a lead frame 1212, and embedded in or combined with moldings or shaped optical elements 1214, 1216, such as inverted cone shapes made of epoxy or glass, forming, for example, lenses. In this embodiment, the shaped optical elements 1214, 1216 are formed on opposite sides, e.g., the top/front and bottom/back sides of the LED, wherein the emitting layer 1200 emits light 1222 that is extracted from both the top/front and bottom/back sides of the LED.

The LED is electrically connected to the lead frame 1218 via bonding pads 1224, 1226. The bonding pad 1224 is deposited on the ITO or ZnO layer 1206, and the ohmic contact/bonding pad 1226 is deposited on the n-type GaN layer 1202 after the n-type GaN 1202 layer is exposed by a selective etch through the p-type GaN layer 1204.

As noted above, the LED may be combined with epoxy or glass and molded as an inverted cone-shapes 1214, 1216 for both the front 1218 and back sides 1220, wherein the inverted cone molding shape 1214, 1216 provides enhanced light extraction. Specifically, most of the light entering the inverted cone shapes 1214, 1216 lies within a critical angle and is extracted. The light is reflected to a top or emitting surface of the inverted cone shape 1214 by the side walls of the inverted cone shape 1214 for emission through the top surface of the inverted cone shape 1214, and similarly, the light is reflected to a bottom or emitting surface of the inverted cone shape 1216 by the side walls of the inverted cone shape 1216 for emission through the bottom surface of the inverted cone shape 1214.

Finally, note that a patterned sapphire substrate (PSS) 1208 improves the light extraction efficiency through the interface 1228 between the n-GaN layer 1202 and the substrate 1208. In addition, the backside 1230 of the sapphire substrate 1208 may be roughened, textured, patterned or shaped (e.g., a cone shaped surface) to increase the light extraction efficiency.

Figure 12B:
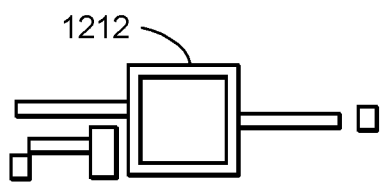

FIG. 12B shows a top view of the lead frame 1212.

Figure 13:
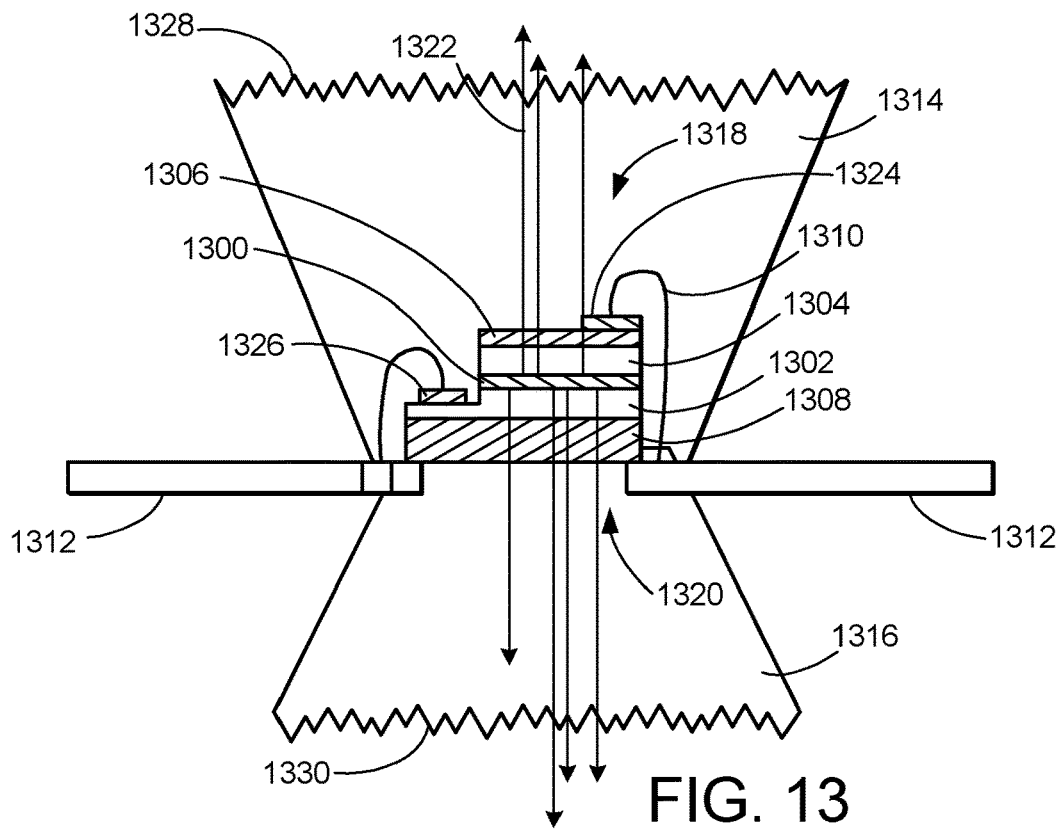
FIG. 13 is a schematic illustration of an improved LED structure according to the preferred embodiment of the present invention.

FIG. 13 is a schematic illustrating a specific improved LED structure according the preferred embodiment of the present invention, wherein the improved LED structure comprises an emitting layer 1300, an n-type GaN layer 1302, a p-type GaN layer 1304, an ITO or ZnO layer 1306, and a substrate 1308, which may be a flat sapphire substrate or a patterned sapphire substrate (PSS). The LED is wire bonded 1310 to a lead frame 1312, and embedded in or combined with moldings or shaped optical elements 1314, 1316, such as inverted cone shapes made of epoxy or glass, forming, for example, lenses. In this embodiment, the shaped optical elements 1314, 1316 are formed on opposite sides, e.g., the top/front and bottom/back sides of the LED, wherein the emitting layer 1300 emits light 1322 that is extracted from both the top/front and bottom/back sides of the LED.

The LED is electrically connected to the lead frame 1318 via bonding pads 1324, 1326. The bonding pad 1324 is deposited on the ITO or ZnO layer 1306, and the ohmic contact/bonding pad 1326 is deposited on the n-type GaN layer 1302 after the n-type GaN 1302 layer is exposed by a selective etch through the p-type GaN layer 1304.

As noted above, the LED may be combined with epoxy or glass and molded as an inverted cone-shapes 1314, 1316 for both the front 1318 and back sides 1320, wherein the inverted cone molding shape 1314, 1316 provides enhanced light extraction. Specifically, most of the light entering the inverted cone shapes 1314, 1316 lies within a critical angle and is extracted. The light is reflected to a top or emitting surface of the inverted cone shape 1314 by the side walls of the inverted cone shape 1314 for emission through the top surface of the inverted cone shape 1314, and similarly, the light is reflected to a bottom or emitting surface of the inverted cone shape 1316 by the side walls of the inverted cone shape 1316 for emission through the bottom surface of the inverted cone shape 1314. Moreover, the top/front surface 1328 of the shaped optical elements 1314, and the bottom/back surface 1330 of the shaped optical element 1316 may be roughened, textured, patterned, or shaped to increase the light extraction through the elements 1314, 1316.

Figure 14:
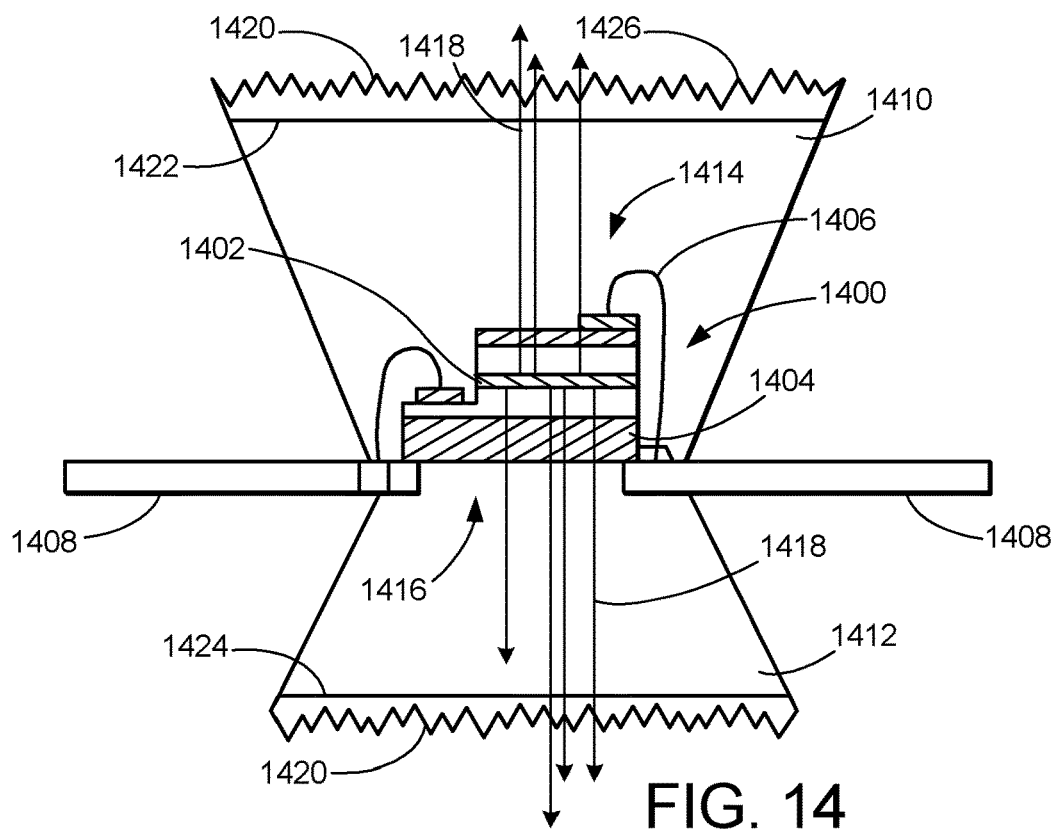
FIG. 14 is a schematic illustration of an improved LED structure according to the preferred embodiment of the present invention.

FIG. 14 is a schematic illustrating a specific improved LED structure according the preferred embodiment of the present invention, wherein the improved LED structure 1400 includes an emitting layer 1402 and a substrate 1404 (as well as other layers), and the substrate 1404 is a flat or patterned sapphire substrate. The LED 1400 is wire bonded 1406 to a lead frame 1408, and embedded in or combined with moldings or shaped optical elements 1410, 1412, such as inverted cone shapes made of epoxy or glass, forming, for example, lenses. In this embodiment, the shaped optical elements 1410, 1412 are formed on opposite sides, e.g., the top/front side 1414 and bottom/back side 1416 of the LED 1400, wherein the emitting layer 1402 emits light 1418 that is extracted from both the top/front side 1414 and bottom/back side 1416 of the LED 1400.

In FIG. 14, phosphor layers 1420 may be placed near the top/front surface 1422 of the shaped optical element 1410 and the bottom/back surface 1424 of the shaped optical element 1412. Preferably, the phosphor layers 1420 should be positioned as far away as possible from the LED 1400. In this case, the conversion efficiency of the blue light to white light is increased, due to reduced re-absorption of the emitted light by the LED 1400 resulting from reduced back-scattering of the light by the phosphor layers 1420 to the LED 1400. Moreover, the surfaces 1426 of the phosphor layers 1420 may be roughened, textured, patterned or shaped to improve light extraction.

Figure 15A:
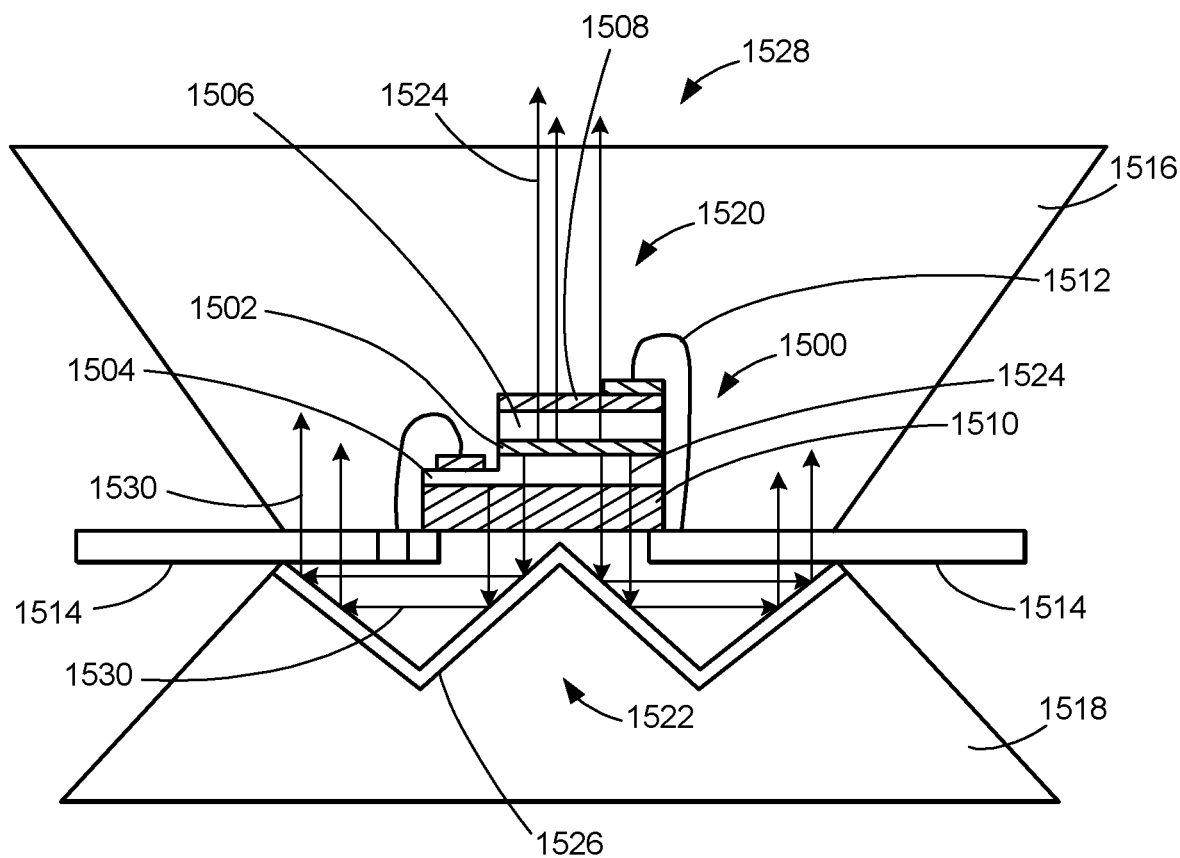
FIGS. 15A and 15B are schematic and plan view illustrations, respectively, of an improved LED structure according to the preferred embodiment of the present invention.

FIG. 15A is a schematic illustrating a specific improved LED structure according the preferred embodiment of the present invention, wherein the improved LED structure 1500 comprises an emitting layer 1502, an n-type GaN layer 1504, a p-type GaN layer 1506, an ITO or ZnO layer 1508, and a substrate 1510, which may be a flat sapphire substrate or a patterned sapphire substrate (PSS).

Figure 15B:
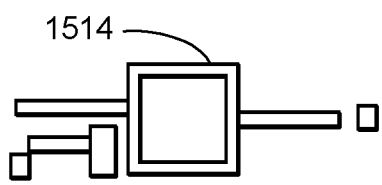

The LED 1500 is wire bonded 1512 to a lead frame 1514, wherein FIG. 15B is a schematic illustration showing the top view of the lead frame 1514.

In this embodiment, the LED 1500 is embedded in or combined with moldings or shaped optical elements 1516, 1518, such as inverted cone shapes made of epoxy or glass, forming, for example, lenses. The shaped optical elements 1516, 1518 are formed on opposite sides, e.g., the top/front side 1520 and bottom/back side 1522 of the LED 1500, wherein the emitting layer 1502 emits light 1524 that is extracted from both the top/front side 1520 and bottom/back side 1522 of the LED 1500.

A mirror 1526 may be placed inside the shaped optical element 1518 to increase the light output to the front side 1528 of the LED 1500. Moreover, the shape of the mirror 1526 is designed to prevent reflections of the light 1530 emitted from the LED 1500 from being re-absorbed by the LED 1500, which would reduce the output power or the efficiency of the LED. Instead, the mirror 1526 guides the reflected light 1530 away from the LED 1500.

In addition, the mirror 1526 is only partially attached (or not attached at all) to the LED 1500 or the substrate 1510. This differs from conventional LEDs, where mirrors are attached to the entire surface of the LED, for example, as shown in FIGS. 1-3.

Figure 16:
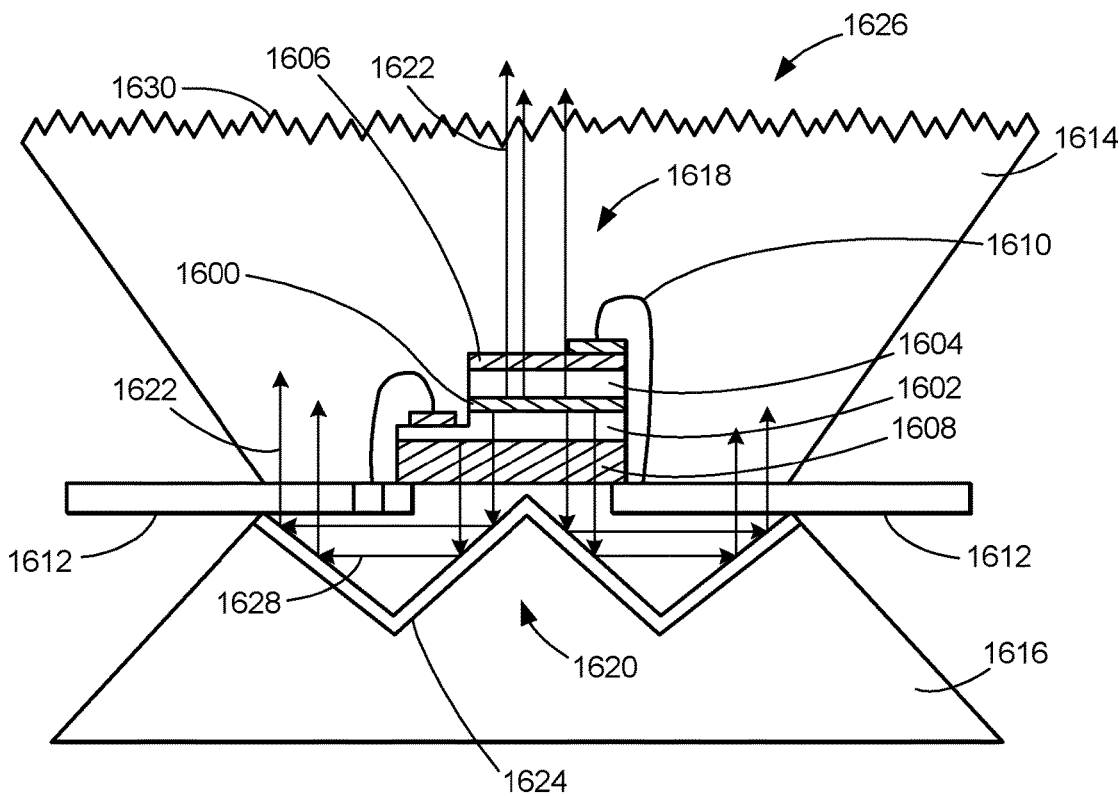
FIG. 16 is a schematic illustration of an improved LED structure according to the preferred embodiment of the present invention.

FIG. 16 is a schematic illustrating a specific improved LED structure according the preferred embodiment of the present invention, wherein the improved LED structure comprises an emitting layer 1600, an n-type GaN layer 1602, a p-type GaN layer 1604, an ITO or ZnO layer 1606, and a substrate 1608, which may be a flat sapphire substrate or a patterned sapphire substrate (PSS). The LED is wire bonded 1610 to a lead frame 1612.

In this embodiment, the LED is embedded in or combined with moldings or shaped optical elements 1614, 1616, such as inverted cone shapes made of epoxy or glass, forming, for example, lenses. The shaped optical elements 1614, 1616 are formed on opposite sides, e.g., the top/front side 1618 and bottom/back side 1620 of the LED, wherein the emitting layer 1602 emits light 1622 that is extracted from both the top/front side 1618 and bottom/back side 1620 of the LED.

A mirror 1624 may be placed inside the shaped optical element 1616 to increase the light output to the front side 1626 of the LED. Moreover, the shape of the mirror 1624 is designed to prevent reflections of the light 1628 emitted from the LED from being re-absorbed by the LED, which would reduce the output power or the efficiency of the LED. Instead, the mirror 1624 guides the reflected light 1628 away from the LED.

In addition, the mirror 1624 is only partially attached (or not attached at all) to the LED or the substrate 1608. This differs from conventional LEDs, where mirrors are attached to the entire surface of the LED, for example, as shown in FIGS. 1-3.

Finally, the top/front surface 1630 of the shaped optical element 1614 is roughened, textured, patterned or shaped to improve light extraction efficiency.

Figure 17:
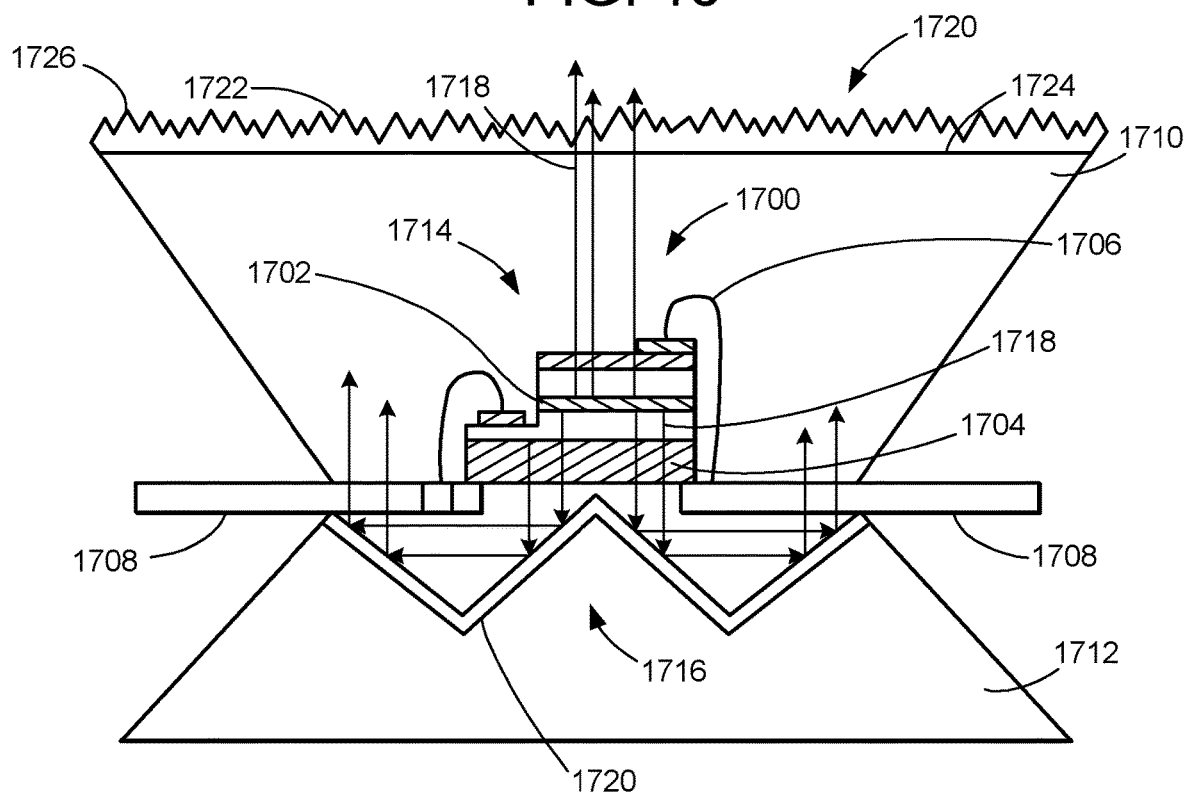
FIG. 17 is a schematic illustration of an improved LED structure according to the preferred embodiment of the present invention.

FIG. 17 is a schematic illustrating a specific improved LED structure according the preferred embodiment of the present invention, wherein the improved LED structure 1700 includes an emitting layer 1702 and a substrate 1704 (as well as other layers), and the substrate 1704 is a flat or patterned sapphire substrate. The LED 1700 is wire bonded 1706 to a lead frame 1708, and embedded in or combined with moldings or shaped optical elements 1710, 1712, such as inverted cone shapes made of epoxy or glass, forming, for example, lenses. In this embodiment, the shaped optical elements 1710, 1712 are formed on opposite sides, e.g., the top/front side 1714 and bottom/back side 1716 of the LED 1700, wherein the emitting layer 1702 emits light 1718 that is extracted from both the top/front side 1714 and bottom/back side 1716 of the LED 1700.

In FIG. 17, a mirror 1720 may be placed inside the shaped optical element 1712 to increase the light output directed to the front side 1720 of the LED 1700. Moreover, a phosphor layer 1722 may be placed near the top surface 1724 of the shaped optical element 1710. Preferably, the phosphor layer 1722 is positioned as far away as possible from the LED 1700. In this case, the conversion efficiency of the blue light to white light is increased, due to reduced re-absorption of the light 1718 emitted from the LED 1700 resulting from reduced back-scattering by the phosphor layer 1722. In addition, the surface 1726 of the phosphor layer 1722 may be roughened, textured, patterned or shaped to improve light extraction through the phosphor layer 1722.

FIG. 18A is a schematic illustrating a specific improved LED structure according the preferred embodiment of the present invention, wherein the improved LED structure 1800 includes an emitting layer 1802 and a substrate 1804 (as well as other layers). The LED 1800 is wire bonded 1806 to a lead frame 1808, wherein FIG. 18B is an illustration showing the top view of the lead frame 1808.

In this embodiment, the LED 1800 is embedded in or combined with a molding or shaped optical element 1810, such as an inverted cone shape made of epoxy or glass, forming, for example, a lens. Light 1812 emitted by the emitting layer 1802 is reflected by mirrors 1814 positioned within the shaped optical element 1810, towards the front side 1816 of the shaped optical element 1810, away from the back side 1818 of the shaped optical element 1810, wherein the reflected light 1820 is output from the shaped optical element 1810.

FIG. 19A is a schematic illustrating a specific improved LED structure according the preferred embodiment of the present invention, wherein the improved LED structure 1900 includes an emitting layer 1902 and a substrate 1904 (as well as other layers). The LED 1900 is wire bonded 1906 to a lead frame 1908, wherein FIG. 19B is an illustration showing the top view of the lead frame 1908.

In this embodiment, the LED 1900 is embedded in or combined with a molding or shaped optical element 1910, such as an inverted cone shape made of epoxy or glass, forming, for example, a lens. Light 1912 emitted by the emitting layer 1902 is reflected by the sidewalls 1914 of the shaped optical element 1910, towards the front side 1916 of the shaped optical element 1910, wherein the reflected light 1918 is output from the shaped optical element 1910, and away from the back side 1920 of the shaped optical element 1910.

Preferably, the LED 1900 is positioned within the shaped optical element 1910 such that the light 1912 emitted by the LED is reflected by mirrored surfaces 1922 of the sidewalls 1914, wherein the mirrored surfaces 1922 are deposited or attached to the sidewalls 1914. The angle 1924 of the sidewalls 1914 relative to the base 1920 of the shaped optical element 1910 is a critical angle that reflects the light 1912 emitted from the LED 1900 to the front side 1916 of the shaped optical element 1910. For example, the refractive index of epoxy is $n_2=1.5$, the refractive index of the air is $n_1=1$, and, as a result, the critical angle of the reflection is $\sin^{-1}(1/1.5)$. Therefore, the angle 1924 of the sidewalls 1914 should be more than $\sin^{-1}(1/1.5)$. This results in the reflected light 1912 from the LED 1900 being effectively extracted from the top surface 1928 of the shaped optical element in the direction labeled by 1926.

FIG. 20A is a schematic illustrating a specific improved LED structure according the preferred embodiment of the present invention, wherein the improved LED structure includes an emitting layer 2000 and a substrate 2002 (as well as other layers). The LED is wire bonded 2004 to a lead frame 2006, wherein FIG. 20B is a top view of the lead frame 2006.

In this embodiment, the LED is embedded in or combined with a molding or shaped optical element 2008, such as an inverted cone shape made of epoxy or glass, forming, for example, a lens. Light 2010 emitted by the emitting layer 2002 is reflected by the sidewalls 2012 of the shaped optical element 2008, towards the front side 2014 of the shaped optical element 2008, wherein the reflected light 2016 is output from the shaped optical element 2008, and away from the back side 2018 of the shaped optical element 2008.

Preferably, the LED is positioned within the shaped optical element 2008 such that the light 2010 emitted by the LED is reflected by the sidewalls 2012. Moreover, the front or top surface 2020 of the shaped optical element 2008 is roughened, textured, patterned or shaped to increase light extraction.

The angle 2022 of the sidewalls 2012 relative to the base 2018 of the shaped optical element 2008 is a critical angle that reflects the 2010 emitted from the LED to the front side 2014 of the shaped optical element 2008. For example, the refractive index of epoxy is $n_2=1.5$, the refractive index of the air is $n_1=1$, and, as a result, the critical angle of the reflection is $\sin^{-1}(1/1.5)$. Therefore, the angle 2022 of the sidewalls 2012 should be more than $\sin^{-1}(1/1.5)$. This results in the reflected light 2010 from the LED being effectively extracted from the front surface 2020 of the shaped optical element 2008.

FIG. 21A is a schematic illustrating a specific improved LED structure according the preferred embodiment of the present invention, wherein the improved LED structure 2100 includes an emitting layer 2102 and a substrate 2104 (as well as other layers). The LED 2100 is wire bonded 2106 to a lead frame 2108, wherein FIG. 21B shows a top view of the lead frame 2108.

In this embodiment, the LED 2100 is embedded in or combined with a molding or shaped optical element 2110, such as an inverted cone shape made of epoxy or glass, forming, for example, a lens. Preferably, the LED 2100 is positioned within the shaped optical element 2110 such that the light 2112 emitted by the LED is reflected by the sidewalls 2114 of the shaped optical element 2110, towards the front side 2116 of the shaped optical element 2110, wherein the reflected light 2118 is output from the shaped optical element 2110, and away from the back side 2120 of the shaped optical element 2110.

A phosphor layer 2122 may be placed on or near the front or top surface 2124 of the shaped optical element 2110. Preferably, the phosphor layer 2122 is placed as far away as possible from the LED 2100. In this example, the conversion efficiency of blue light to white light is increased due to reduced re-absorption of the light 2112 by the LED 2100 resulting from reduced back-scattering by the phosphor layer 2122. In addition, the surface 2126 of the phosphor layer 2122 may be roughened, textured, patterned or shaped to increase light extraction.

Figure 22A:
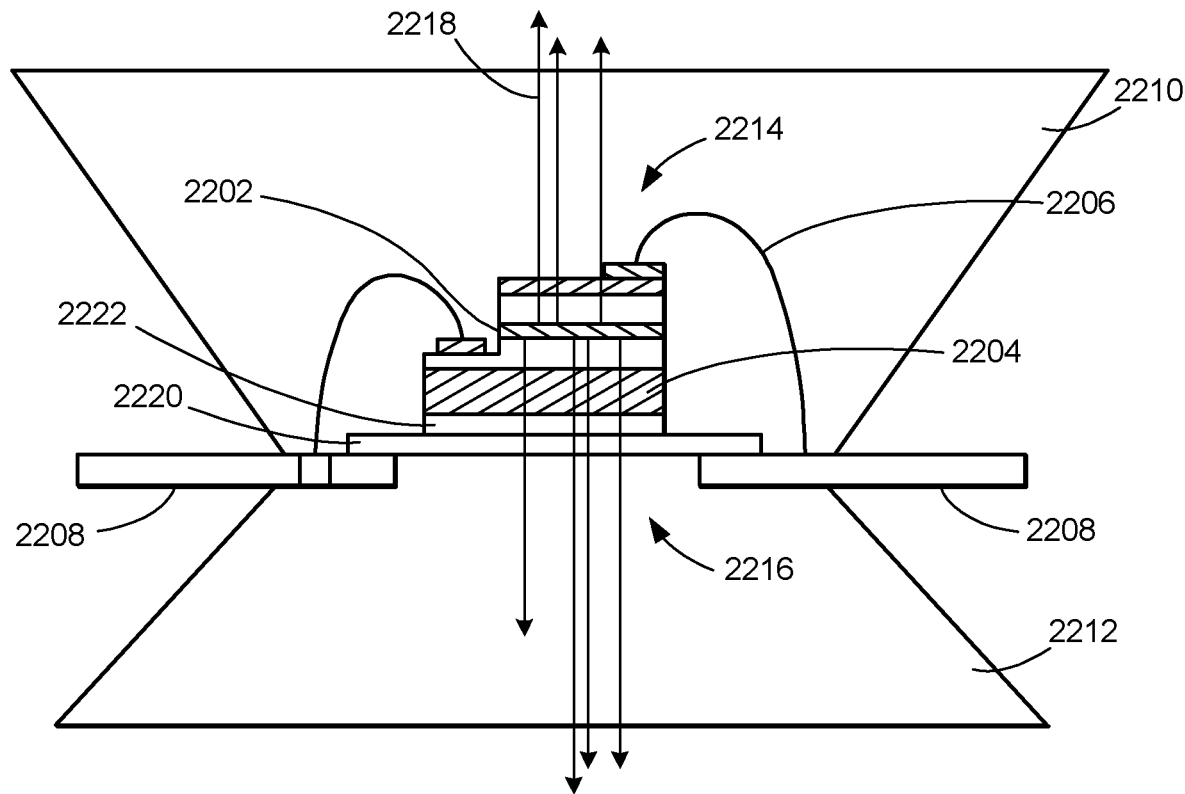
FIGS. 22A and 22B are schematic and plan view illustrations, respectively, of an improved LED structure according to the preferred embodiment of the present invention.
Figure 22B:
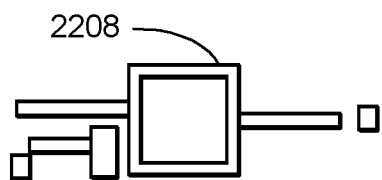

FIG. 22A is a schematic illustrating a specific improved LED structure according the preferred embodiment of the present invention, wherein the improved LED structure 2200 includes an emitting layer 2202 and a substrate 2204 (as well as other layers). The LED 2200 is wire bonded 2206 to a lead frame 2208, wherein FIG. 22B shows a top view of the lead frame 2208.

The LED 2200 is embedded in or combined with moldings or shaped optical elements 2210, 2212, such as inverted cone shapes made of epoxy or glass, forming, for example, lenses. In this embodiment, the shaped optical elements 2210, 2212 are formed on opposite sides, e.g., the top/front side 2214 and bottom/back side 2216 of the LED 2200, wherein the emitting layer 2200 emits light 2218 that is extracted from both the top/front side 2214 and bottom/back side 2216 of the LED 2200.

The lead frame 2208 includes a transparent plate 2220, wherein the LED 2200 is bonded to the transparent plate 2220 using a transparent/clear epoxy 2222 as a die-bonding material. The transparent plate 2220 may be comprised of glass, quartz, sapphire, diamond or other material transparent for the desired emission wavelength, wherein the transparent glass plate 2220 effectively extracts the light 2218 emitted from the LED 2200 to the shaped optical element 2212.

Advantages and Improvements

One advantage of the present invention is that all of the layers of the LED are transparent for the emission wavelength, except for the emitting layer, such that the light is extracted effectively through all of the layers.

Moreover, by avoiding the use of intentional mirrors with the LED, re-absorption of light by the LED is minimized, light extraction efficiency is increased, and light output power is increased.

The combination of a transparent electrode with roughened, textured, patterned or shaped surfaces, with the LED embedded within a shaped optical element or lens, results in increased light extraction.

REFERENCES

The following references are incorporated by reference herein:
1. Appl. Phys. Lett., 56, 737-39 (1990).
2. Appl. Phys. Lett., 64, 2839-41 (1994).
3. Appl. Phys. Lett., 81, 3152-54 (2002).
4. Jpn. J. Appl. Phys., 43, L1275-77 (2004).
5. Jpn. J. Appl. Phys., 45, L1084-L1086 (2006).
6. Jpn. J. Appl. Phys., 34, L797-99 (1995).
7. Jpn. J. Appl. Phys., 43, L180-82 (2004).
8. Fujii T., Gao Y., Sharma R., Hu E. L., DenBaars S. P., Nakamura S., "Increase in the extraction efficiency of GaN-based light-emitting diodes via surface roughening," Applied Physics Letters, vol. 84, no. 6, 9 Feb. 2004, pp. 855-7.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching.

What is claimed is:
1. A light emitting device, comprising:
   a transparent surface, a cathode on a first end of the transparent surface and an anode on a second end of the transparent surface, wherein the cathode and anode provide structural support to the transparent surface and are adapted to provide an electrical connection between the light emitting device and a structure outside the light emitting device;
   at least one III-nitride light emitting diode (LED) comprising a sapphire growth substrate, the LED in mechanical communication with the transparent surface, and the LED and transparent surface configured to extract light emitted by the LED through the transparent surface; and
   a molding comprising a phosphor and surrounding the LED, the molding configured to extract light from both a front side of the light emitting device and a back side of the light emitting device.
2. The light emitting device of claim 1, wherein the sapphire growth substrate is a patterned sapphire substrate (PSS).
3. The light emitting device of claim 1, wherein the transparent surface comprises glass.
4. The light emitting device of claim 1, wherein the transparent surface comprises quartz.
5. The light emitting device of claim 1, wherein the transparent surface comprises diamond.
6. The light emitting device of claim 1, wherein the transparent surface comprises a material transparent for an emission wavelength.

* * * * *